United States Patent
Imwalle et al.

(10) Patent No.: US 9,760,098 B1
(45) Date of Patent: Sep. 12, 2017

(54) COOLING A DATA CENTER

(71) Applicant: Google Inc., Mountain View, CA (US)

(72) Inventors: Gregory P. Imwalle, Mountain View, CA (US); Jeremy Rice, San Jose, CA (US)

(73) Assignee: Google Inc., Mountain View, CA (US)

( * ) Notice: Subject to any disclaimer, the term of this patent is extended or adjusted under 35 U.S.C. 154(b) by 950 days.

(21) Appl. No.: 13/770,616

(22) Filed: Feb. 19, 2013

Related U.S. Application Data

(60) Provisional application No. 61/731,934, filed on Nov. 30, 2012.

(51) Int. Cl.
*G05B 13/00* (2006.01)
*G05D 23/19* (2006.01)

(52) U.S. Cl.
CPC .................. *G05D 23/19* (2013.01)

(58) Field of Classification Search
USPC ........................................ 700/276
See application file for complete search history.

(56) References Cited

U.S. PATENT DOCUMENTS

| 7,272,732 B2 * | 9/2007 | Farkas | G06F 1/206 713/300 |
| 7,905,096 B1 * | 3/2011 | Campbell | H05K 7/20836 62/259.2 |
| 2010/0032142 A1 * | 2/2010 | Copeland | G05D 23/1925 165/104.33 |

OTHER PUBLICATIONS

Barroso et al, "The Case for Energy-Proportional Computing", 2007 IEEE.*

* cited by examiner

*Primary Examiner* — Carlos Ortiz Rodriguez
(74) *Attorney, Agent, or Firm* — Fish & Richardson P.C.

(57) ABSTRACT

Techniques for cooling a data center include circulating a first cooling medium to cool a plurality of rack-mounted computers; circulating a second cooling medium to cool the plurality of rack-mounted computers; determining that a first portion of the plurality of rack-mounted computers is operating at a power usage above a threshold power usage; adjusting at least one of a flow rate of the first or second cooling mediums to cool a second portion of the plurality of rack-mounted computers; and rerouting a portion at least one the first or second cooling mediums to cool the first portion of the plurality of rack-mounted computers.

26 Claims, 11 Drawing Sheets

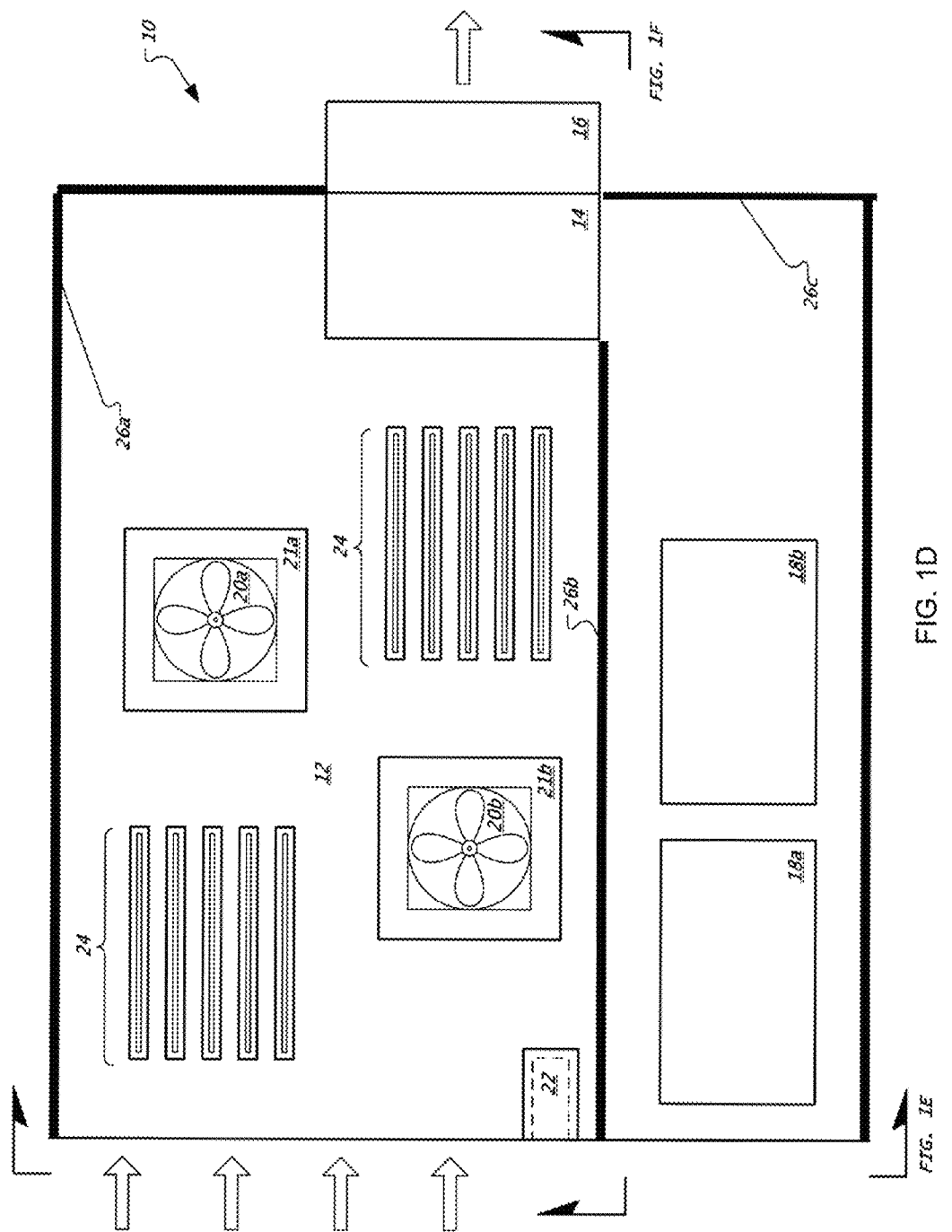

COOLING A DATA CENTER

CROSS REFERENCE TO RELATED APPLICATIONS

This application claims priority under 35 U.S.C. §119 to U.S. Provisional Patent Application Ser. No. 61/731,934, entitled "Cooling a Data Center," filed on Nov. 30, 2012, the entire contents of which are incorporated herein by reference.

TECHNICAL BACKGROUND

This disclosure relates to managing performance of one or more computers that operate in a data center.

BACKGROUND

Computer users often focus on the speed of computer microprocessors, e.g., megahertz and gigahertz. Many forget that this speed often comes with a cost—higher power consumption. For one or two home PCs, this extra power may be negligible when compared to the cost of running the many other electrical appliances in a home. But in data center applications, where thousands of microprocessors may be operated, electrical power requirements can be very important.

Power consumption is also, in effect, a double whammy. Not only must a data center operator pay for electricity to operate its many computers, but the operator must also pay to cool the computers. That is because, by simple laws of physics, all the power has to go somewhere, and that somewhere is, in the end, conversion into heat. A pair of microprocessors mounted on a single motherboard can draw hundreds of watts or more of power. Multiply that figure by several thousand, or tens of thousands, to account for the many computers in a large data center, and one can readily appreciate the amount of heat that can be generated. It is much like having a room filled with thousands of burning floodlights. The effects of power consumed by the critical load in the data center are often compounded when one incorporates all of the ancillary equipment required to support the critical load.

Thus, the cost of removing all of the heat can also be a major cost of operating large data centers. That cost typically involves the use of even more energy, in the form of electricity and natural gas, to operate chillers, condensers, pumps, fans, cooling towers, and other related components. Heat removal can also be important because, although microprocessors may not be as sensitive to heat as are people, increases in temperature can cause great increases in microprocessor errors and failures. In sum, a data center requires a large amount of electricity to power the critical load, and even more electricity to cool the load.

SUMMARY

In a general implementation, techniques for cooling a data center includes circulating a cooling airflow to cool a plurality of computing devices supported in racks in a data center; monitoring power usage of the plurality of computing devices; determining that a first portion of the plurality of computing devices are operating at a power usage above a threshold power usage; and based on the determination, decreasing a flow rate of a portion of a cooling liquid in the data center that is circulated to cool a second portion of the plurality of computing devices that are operating at a power usage below the threshold power usage; increasing a portion of the cooling airflow circulated to cool the second portion of the plurality of computing devices such that a rate of heat removal from the second portion of the plurality of computing devices remains substantially constant; and increasing a flow rate of a portion of the cooling liquid in the data center that is circulated to cool the first portion of the plurality of computing devices such that a rate of heat removal from the first portion of the plurality of computing devices increases.

In a first aspect combinable with the general implementation, monitoring power usage of the plurality of computing devices includes monitoring a utilization of each of the plurality of computing devices.

In a second aspect combinable with any of the previous aspects, the threshold power usage corresponds to an adjustable threshold utilization that is a particular percentage of a maximum utilization.

In a third aspect combinable with any of the previous aspects, the adjustable threshold utilization is about 70% of maximum utilization.

In a fourth aspect combinable with any of the previous aspects, utilization includes CPU utilization of the plurality of computing devices.

A fifth aspect combinable with any of the previous aspects further includes rerouting at least some of the portion of a cooling liquid in the data center that is circulated to cool the second portion of the plurality of computing devices to increase the flow rate of the portion of the cooling liquid in the data center that is circulated to cool the first portion of the plurality of computing devices.

A sixth aspect combinable with any of the previous aspects further includes monitoring a temperature at or near the first portion of the plurality of computing devices.

A seventh aspect combinable with any of the previous aspects further includes subsequent to increasing flow rate of a portion of the cooling liquid in the data center that is circulated to cool the first portion of the plurality of computing devices, determining that the temperature remains substantially constant or that the temperature rises at or near the first portion of the plurality of computing devices.

An eighth aspect combinable with any of the previous aspects further includes based on the determination that the temperature remains substantially constant or that the temperature rises at or near the first portion of the plurality of computing devices, increasing a portion of the cooling airflow circulated to cool the first portion of the plurality of computing devices such that the rate of heat removal from the first portion of the plurality of computing devices further increases.

A ninth aspect combinable with any of the previous aspects further includes determining that the first portion of the plurality of computing devices are operating at a power usage at or below the threshold power usage for a predetermined time duration, or that the first portion of the plurality of computing devices are operating at a power usage at a particular setpoint below the threshold power usage.

A tenth aspect combinable with any of the previous aspects further includes based on the determination, decreasing the flow rate of the portion of the cooling liquid in the data center that is circulated to cool the first portion of the plurality of computing devices.

An eleventh aspect combinable with any of the previous aspects further includes modulating an airflow circulated to cool the first portion of the plurality of computing devices to maintain the rate of heat removal from the first portion of the plurality of computing devices.

In a twelfth aspect combinable with any of the previous aspects, the data center includes a cooling capacity that is less than a cooling load required to cool all of the plurality of computing devices operating at a maximum power draw.

A thirteenth aspect combinable with any of the previous aspects further includes deploying an additional plurality of computing devices supported in racks in the data center.

In another general implementation, a data center cooling management system includes a plurality of rack-mounted computers; one or more cooling modules positioned near the plurality of rack-mounted computers; and a control system including one or more sensors and one or more flow control devices. The control system is operable to perform operations including controlling one or more cooling modules to circulate a cooling airflow to cool the plurality of rack-mounted computers; monitoring, with the one or more sensors, power usage of the plurality of rack-mounted computers; determining, with the one or more sensors, that a first portion of the plurality of rack-mounted computers are operating at a power usage above a threshold power usage; and based on the determination, controlling the one or more flow control devices to decrease a flow rate of a portion of a cooling liquid in the data center that is circulated to cool a second portion of the plurality of rack-mounted computers that are operating at a power usage below the threshold power usage; controlling the one or more cooling modules to increase a portion of the cooling airflow circulated to cool the second portion of the plurality of rack-mounted computers such that a rate of heat removal from the second portion of the plurality of rack-mounted computers remains substantially constant; and controlling the one or more flow control devices to increase a flow rate of a portion of the cooling liquid in the data center that is circulated to cool the first portion of the plurality of rack-mounted computers such that a rate of heat removal from the first portion of the plurality of rack-mounted computers increases.

In a first aspect combinable with the general implementation, monitoring power usage of the plurality of rack-mounted computers includes monitoring a utilization of each of the plurality of rack-mounted computers.

In a second aspect combinable with any of the previous aspects, the threshold power usage corresponds to an adjustable threshold utilization that is a particular percentage of a maximum utilization.

In a third aspect combinable with any of the previous aspects, the adjustable threshold utilization is about 70% of maximum utilization.

In a fourth aspect combinable with any of the previous aspects, the operations further include controlling the one or more flow control devices to circulate at least some of the portion of the cooling liquid in the data center that is circulated to cool the second portion of the plurality of rack-mounted computers to increase the flow rate of the portion of the cooling liquid in the data center that is circulated to cool the first portion of the plurality of rack-mounted computers.

In a fifth aspect combinable with any of the previous aspects, the operations further include monitoring, with the one or more sensors, a temperature at or near the first portion of the plurality of rack-mounted computers.

In a sixth aspect combinable with any of the previous aspects, the operations further include subsequent to increasing flow rate of a portion of the cooling liquid in the data center that is circulated to cool the first portion of the plurality of rack-mounted computers, determining that the temperature remains substantially constant or that the temperature rises at or near the first portion of the plurality of rack-mounted computers.

In a seventh aspect combinable with any of the previous aspects, the operations further include based on the determination that the temperature remains substantially constant or that the temperature rises at or near the first portion of the plurality of rack-mounted computers, controlling the one or more cooling modules to increase a portion of the cooling airflow circulated to cool the first portion of the plurality of rack-mounted computers such that a rate of heat removal from the first portion of the plurality of rack-mounted computers further increases.

In an eighth aspect combinable with any of the previous aspects, the operations further include determining that the first portion of the plurality of rack-mounted computers are operating at a power usage at or below the threshold power usage for a predetermined time duration, or that the first portion of the plurality of rack-mounted computers are operating at a power usage at a particular setpoint below the threshold power usage.

In a ninth aspect combinable with any of the previous aspects, the operations further include based on the determination, controlling the one or more flow control devices to decrease the flow rate of the portion of the cooling liquid in the data center that is circulated to cool the first portion of the plurality of rack-mounted computers.

In a tenth aspect combinable with any of the previous aspects, the operations further include controlling the one or more cooling devices to modulate an airflow circulated to cool the first portion of the plurality of rack-mounted computers to maintain the rate of heat removal from the first portion of the plurality of rack-mounted computers.

In an eleventh aspect combinable with any of the previous aspects, the one or more flow control devices include one or more pumps; one or more control valves; or one or more variable frequency motor controllers.

In a twelfth aspect combinable with any of the previous aspects further includes one or more cooling plants that include a cooling capacity that is less than a cooling load to cool all of the plurality of rack-mounted computers operating at a maximum power draw.

In another general implementation, a method for cooling a data center includes circulating a first cooling medium to cool a plurality of rack-mounted computers; circulating a second cooling medium to cool the plurality of rack-mounted computers; determining that a first portion of the plurality of rack-mounted computers is operating at a power usage above a threshold power usage; adjusting at least one of a flow rate of the first or second cooling mediums to cool a second portion of the plurality of rack-mounted computers; and rerouting a portion at least one of a flow rate of the first or second cooling mediums to cool the first portion of the plurality of rack-mounted computers.

A first aspect combinable with the general implementation further includes determining that the second portion of the plurality of rack-mounted computers is operating at a power usage below a threshold power usage.

In a second aspect combinable with any of the previous aspects, the first cooling medium is a cooling airflow and the second cooling medium is a cooling liquid.

In a third aspect combinable with any of the previous aspects, adjusting at least one of a flow rate of the first or second cooling mediums to cool a second portion of the plurality of rack-mounted computers includes increasing a flow rate of the cooling airflow to cool the second portion of the plurality of rack-mounted computers; and decreasing a flow rate of the cooling liquid to cool the second portion of the plurality of rack-mounted computers.

In a fourth aspect combinable with any of the previous aspects, circulating a second cooling medium to cool the plurality of rack-mounted computers includes circulating, to the data center, a cooling liquid flow from one or more central plants that include a cooling capacity less than a maximum cooling capacity required to cool the plurality of rack-mounted computers operating at a maximum power load.

Various implementations of techniques for cooling a data center may include one or more of the following features. For example, a data center with excess airflow capacity (e.g., the capability to circulate more airflow than would ever be needed in particular locations) may increase airflow rates to cool certain groups of computers or servers so that cooling liquid may be rerouted to cool other groups of computers or servers. As data center cooling capacity may not have excess cooling liquid available, rerouting the available cooling liquid may more efficiently cool computers that are operating at a maximum or higher than normal power load. In some aspects, a vast majority of computers or servers may operate most efficiently even while the data center has the capability to cool the hardest working computers or servers. As another example, such techniques may allow for construction of a data center (and more particularly, one or more central cooling plants) to be reduced in cooling capacity while still being capable of meeting year-round cooling needs. As another example, a data center with excess cooling liquid capacity (e.g., the capability to circulate more cooling liquid than would ever be needed in particular locations) may increase cooling liquid flow rates to cool certain groups of computers or servers so that cooling airflow may be rerouted to cool other groups of computers or servers.

These general and specific aspects may be implemented using a device, system or method, or any combinations of devices, systems, or methods. For example, a system of one or more computers can be configured to perform particular actions by virtue of having software, firmware, hardware, or a combination of them installed on the system that in operation causes or cause the system to perform the actions. One or more computer programs can be configured to perform particular actions by virtue of including instructions that, when executed by data processing apparatus, cause the apparatus to perform the actions. The details of one or more implementations are set forth in the accompanying drawings and the description below. Other features, objects, and advantages will be apparent from the description and drawings, and from the claims.

DESCRIPTION OF DRAWINGS

FIGS. 1D-1F show various views of an example tray in a rack-mount computer system, having dual-zone power supply ventilation;

DETAILED DESCRIPTION

Figure 1A:
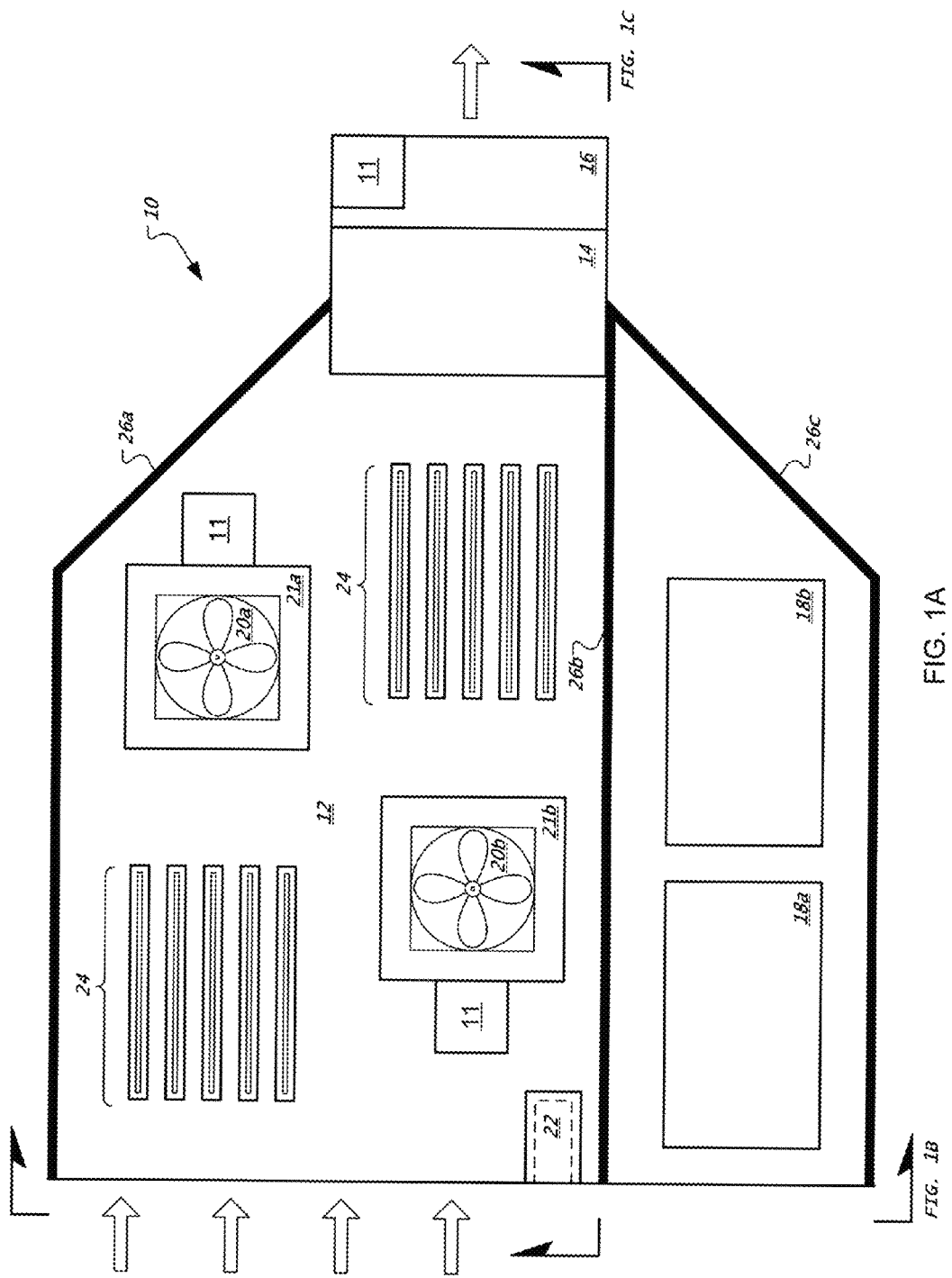
FIGS. 1A-1C show various views of an example tray in a rack-mount computer system.
Figure 1B:
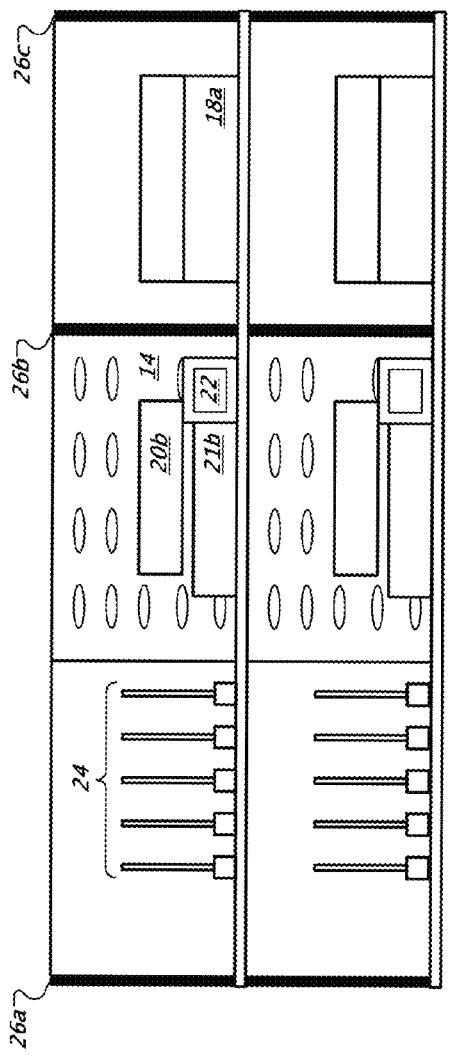
Figure 1C:
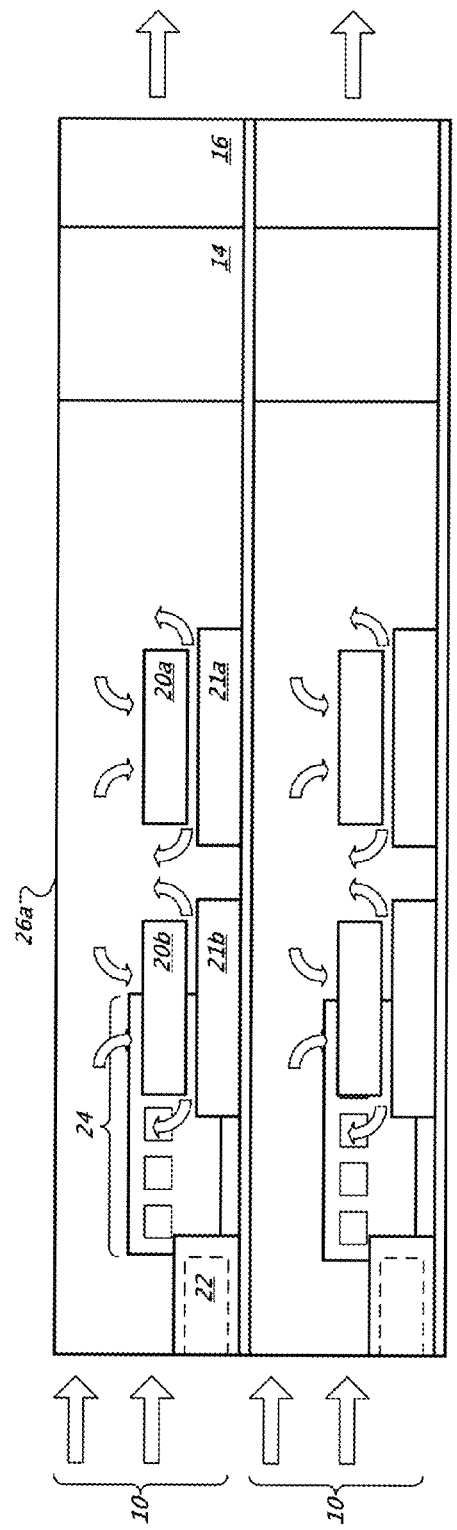

FIG. 1A shows a plan view of a tray 10 in a rack-mount computer system, while FIG. 1B shows a front view, and FIG. 1C shows a side view, of the tray 10 in FIG. 1A. The term "tray" is not limited to any particular arrangement, but instead includes any arrangement of computer-related components coupled together to serve a particular purpose, such as on a motherboard. Trays may be generally mounted parallel to other trays in a horizontal or vertical stack, so as to permit denser packing than would otherwise be possible with computers having free-standing housings and other components. The term "blade" may also be employed to refer to such apparatuses, though that term too should not be limited to a particular arrangement. Trays may be implemented in particular configurations, including as computer servers, switches, e.g., electrical and optical, routers, drives or groups of drives, and other computing-related devices. In general, the trays in a system take a standardized physical and electrical form to be easily interchangeable from one location in the system to another, but the trays may take other appropriate forms.

Various implementations of techniques for cooling a data center may include one or more of the following features. For example, a data center with excess airflow capacity (e.g., the capability to circulate more airflow than would ever be needed in particular locations) may increase airflow rates to cool certain groups of computers or servers so that cooling liquid may be rerouted to cool other groups of computers or servers. As data center cooling capacity may not have excess cooling liquid available, rerouting the available cooling liquid may more efficiently cool computers that are operating at a maximum or higher than normal power load. In some aspects, a vast majority of computers or servers may operate most efficiently even while the data center has the capability to cool the hardest working computers or servers. As another example, such techniques may allow for construction of a data center (and more particularly, one or more central cooling plants) to be reduced in cooling capacity while still being capable of meeting year-round cooling needs. As another example, a data center with excess cooling liquid capacity (e.g., the capability to circulate more cooling liquid than would ever be needed in particular locations) may increase cooling liquid flow rates to cool certain groups of computers or servers so that cooling airflow may be rerouted to cool other groups of computers or servers.

In some general implementations, and as described more fully below, tray 10 (and many multiples of tray 10) may be installed in a data center and operated to execute and/or manage one or more software applications. In so operating, the trays 10 may generate significant amounts of heat that must be removed by, for instance, cooling modules (e.g., fan coil units) that are positioned near the trays 10. In some aspects, such cooling modules may capture an airflow that is circulated over the trays 10 and heated by the components of the tray 10. Once captured (e.g., in a warm air plenum), the air may be cooled (e.g., by cooling coils) and recirculated to again flow over the trays 10.

In some implementations, placement of the cooling modules may be determined by, for instance, a predicted or calculated power draw by the trays 10. For example, more cooling modules may be placed near trays 10 that are predicted to have high usage or utilization and, therefore, high heat generation. Less cooling modules may be placed near trays 10 that are predicted to have low usage or utilization and, therefore, low heat generation. The applications running on the trays 10, and the power usage of the trays 10, may vary significantly from the predicated operational constraints.

To better dissipate heat load from trays 10 that are operating at a higher than expected usage, cooling modules may be physically moved. This, however, may be impractical. As another solution, excess airflow capacity may be utilized. But due to the nature of air circulation (e.g., cost per cooling capacity unit, horsepower requirements, and otherwise), this too may be impractical. Modulating and rerouting a cooling liquid, e.g., chilled water, to pinpoint locations of trays 10 that need more cooling may be more efficient (e.g., due to relative costs of pumping liquid vs. air, relative costs of installing piping vs. ductwork, and otherwise). Thus, the capability to "move cooling liquid" from location to location in the data center may be advantageous as explained herein.

In general, the tray 10 may include a standard circuit board 12 on which a variety of components are mounted. The board 12 may be arranged so that air enters at its front edge (to the left in the figure), is routed over a number of heat generating components on the board 12, and is drawn through a power supply 14 and fan 16 before being exhausted from the tray 10. The fan 16 may also be arranged to push air through the power supply 14. In addition, the fan 16 may be located in other positions relative at other positions along the back edge of the tray and at locations away from a back edge of the tray 10. The power supply 14 may likewise be positioned at other locations and need not be joined to the fan 16.

In this arrangement, the heat from power supply 14 may be picked up after the heat from other components on the board 12 is picked up by the air flow. In this manner, the speed of fan 16 may be controlled to maintain a set temperature for the air exiting the board 12, or for temperatures at other points on the tray 10. For example, a thermocouple or other sort of temperature sensor may be placed in the air flow, such as upstream of the power supply 14 or downstream of the fan 16, and the fan speed may be modulated to maintain a set temperature. The temperature of the exiting air may also be highly elevated compared to systems that do not control airflow in this manner. It may be more efficient to cool this air than it would be to cool air that does not have such an elevated temperature.

Air may be routed over board 12 by walls 26a, 26b, 26c. Wall 26a may block one side of board 12, and may funnel air toward openings in power supply 14. Where the walls 26a, 26c do not taper, the air may otherwise be directed to the fan 16. Wall 26c may block one side of board 12, so as to prevent air from moving directly from the workspace into an area behind tray 10, e.g., to the right in the figure. For example, a plenum may be provided behind multiple boards in the form of an open wall into which the boards may be placed, or in the form of a wall having multiple openings into which fans may be slid. In certain implementations, fully blocking or sealing of such a plenum may not be necessary, such as when the pressure difference between the plenum and the workspace is minimal.

Wall 26b separates one portion of tray 10 from another. In particular, wall 26b separates the portion of tray 10 containing heat generating components, such as microprocessors 21a, 21b, from components that generate substantially less heat, such as hard drives 18a, 18b. In making such a separation, wall 26b substantially blocks airflow over the components that generate less heat, and increases airflow over the heat generating components. In addition, wall 26b is arranged to route airflow into openings in power supply 14. Although not pictured, wall 26b may block areas on tray 10 but may provide that each blocked area, e.g., the area on each side of wall 26b, may still be in fluid communication with fan 16. For example, fan 16 may be designed to have openings that will lie on each side of wall 26b, and the openings may be sized or otherwise tuned so as to provide for relative levels of air flow on the opposing sides of the wall 26b. The "tuning" of the air flow may be made to match the relative thermal load of components on each side of wall 26b, so that more air flows on the side of wall 26b having the most thermal load, or that otherwise requires more cooling.

Board 12 may hold a variety of components needed in a computer system. As shown, board 12 holds a dual processor computer system that uses processor 21a and processor 21b connected to a bank of memory 24. The memory 24 may be in the form, for example, of a number of single in-line memory modules (SIMMs), dual in-line memory module (DIMMs), or other appropriate form. Other components of the computer system, such as chip sets and other chips, have been omitted for clarity in the figure, and may be selected and arranged in any appropriate manner.

Board 12 may also be provided with connections to other devices. Network jack 22, such as in the form of an RJ-45 jack or an optical networking connection, may provide a network connection for tray 10. Other connections may also be provided, such as other optical networking connections, video output connections, and input connections such as keyboard or pointing device connections (not shown).

Impingement fans 20a, 20b may be mounted above each microprocessor 21a, 21b, to blow air downward on the microprocessors 21a, 21b. In this manner, impingement fans 20a, 20b may reduce boundary layer effects that may otherwise create additional heat buildup on microprocessors 21a, 21b. As a result, lateral airflow across tray 10 can be reduced even further, while still adequately controlling the temperature rise to the microprocessors 21a, 21b.

In the illustrated embodiment, actuators 11 are shown communicably coupled to impingement fans 20a and 20b, as well as fan 16. In some implementations, the actuators 11 may control the fans, e.g., speed, based on one or more inputs, such as, for example, operating temperature, microprocessor frequency, or other input. For example, as explained more fully in FIG. 2, the actuators 11 may be controlled based on a control output based on thermal margin of a microprocessor, e.g., microprocessors 21a and 21b.

Other heat relief mechanisms may also, or alternatively, be provided for microprocessors 21a, 21b. For example, one or more heat sinks may be provided, such as in the form of certain finned, thermally conductive structures. The heat sinks may be directly connected to microprocessors 21a, 21b, or may be located to the sides of microprocessors 21a, 21b, and may be attached by heat pipes to plates mounted to the top of microprocessors 21a, 21b. Thermally conductive grease or paste may be provided between the tops of microprocessors 21a, 21b, and any heat sinks to improve heat flow out of microprocessors 21a, 21b.

In operation, tray 10 may be mounted flat horizontally in a server rack such as by sliding tray 10 into the rack from the rack front, and over a pair of rails in the rack on opposed sides of the tray 10—much like sliding a lunch tray into a cafeteria rack, or a tray into a bread rack. Tray 10 may alternatively be mounted vertically, such as in a bank of trays mounted at one level in a rack. The front of the rack may be kept open to permit easy access to, and replacement of, trays and to permit for air to flow over the tray 10 from a workspace where technicians or other professionals operating a data center may be located. In this context, the term workspace is intended to refer to areas in which technicians or others may normally be located to work on computers in a data center.

After sliding a tray 10 into a rack, a technician may connect a tray to appropriate services, such as a power supply connection, battery back-up, and a network connection. The tray 10 may then be activated, or booted up, and may be communicated with by other components in the system.

Although tray 10 is shown in the figures to include a multi-processor computer system, other arrangements may be appropriate for other trays. For example, tray 10 may include only hard drives and associated circuitry if the purpose of the tray is for storage. Also, tray 10 may be provided with expansion cards such as by use of a riser module mounted transversely to the board 12. Although particular forms of tray 10 may be provided, certain advantages may be achieved in appropriate circumstances by the use of common trays across a rack or multiple racks. In particular, great efficiencies may be gained by standardizing on one or a small handful of trays so as to make interaction between trays more predictable, and to lower the need to track and store many different kinds of trays.

A data center may be made up of numerous trays (hundreds or thousands), each mounted in one of numerous racks. For example, several dozen trays may be mounted in a single rack within a space, with approximately several inches between each tray. As explained in more detail below, each of the trays in a rack may back up to a warm air plenum that receives exhaust air from the trays and routes that air to a cooling unit that may re-circulate the air into the workspace in front of the racks.

Trays may also be packaged in groups. For example, two stacked trays may be matched as a pair, with one fan 16 serving both trays (not shown). Specifically, the fan 16 may be approximately double the height and diameter of a single tray unit, and may extend from the lower tray in a pair up to the top of the upper tray in a pair. By such an arrangement, the slowest turning portions of the fan, in the fan center, will be near the board of the top tray, where less airflow will normally occur because of boundary layer effects. The larger and faster moving portions of the fan 16 will be located nearer to the free areas of each tray 10 so as to more efficiently move air over the trays and through the respective power supplies more freely. In addition, a double-height fan may be able to move more air than can a single-height fan, at lower rotation speeds. As a result, a fan in such an arrangement may produce less noise, or noise at a more tolerable frequency, than could a smaller fan. Parallel fans may also be used to increase flow, and serial fans may be used to increase pressure, where appropriate.

Fan 16 may be controlled to maintain a constant temperature for air exiting fan 16 or at another point. By locating fan 16 downstream of power supply 14, and power supply 14 downstream of the other components of tray 10, the arrangement may maximize the heat rise across tray 10, while still maintaining adequately low temperatures for heat-sensitive components mounted to board 12, such as microprocessors 21*a*, 21*b*. Also, the power supply 14 may be less sensitive to higher temperatures than are other components, and so may be best located at the end of the air flow, where the temperatures are highest.

Although many applications seek to substantially increase airflow across heat generating components so as to increase the rate of heat dissipation from the components, the arrangement pictured here allows airflow across tray 10 to be slowed substantially to increase the temperature rise across tray 10. Increasing the temperature rise decreases the mass flow rate, and can make cooling across the entire system more efficient.

In particular, when the temperature of the warm exiting air is increased, the difference in temperature between the warm air and any cooling water entering a cooling coil to cool the warm air, also increases. The ease of heat transfer is generally directly proportional to this difference in temperature. Also, when the difference in temperature is relatively small, increasing the difference by only one or two degrees can produce a substantial increase in the amount of heat exchange between the warm air and the cooling water. As a result, a system run at higher exhaust temperatures from board 12 can provide substantial advantages in efficiency, and lower energy consumption.

In certain implementations, the temperature rise across tray 10 may be approximately 20° C. As one example, air may enter the space above board 12 from a workspace at 25° C., and may exit fan 16 at 45° C. The entering temperature may also be about 21-30° C. (70-86° F.), and the exiting temperature 40-50° C. (104-122° F.). The 45° C. exhaust temperature or other temperature may be selected as a maximum temperature for which the components in tray 10 can be maintained without significant errors or breakdowns, or a safe temperature of operation. The 25° C. entering temperature or other temperature may be a temperature determined to create a comfortable or tolerable temperature in the workspace in a data center. The entering temperature may also be linked to a maximum allowable temperature, such as a federal or state OSHA-mandated maximum temperature. The entering temperature could be approximately 40° Celsius, which matches certain limits established by bodies governing workplace safety.

In other implementations, air may enter the space above board 12 at a temperature of 50° C., where appropriate thermal removal mechanisms or methods are provided for the components on board 12. For example, conductive and liquid-cooled components may be placed in contact with microprocessors 21*a*, 21*b* to increase the rate of heat dissipation from those components. Where a higher input temperature is selected, the temperature difference across tray 10 will generally be lower than if a lower input temperature is selected. However, heat will be easier to remove from such heated air when it passes through a cooling coil. Higher temperatures for expected breakdowns include components that tolerate case temperatures of 85 degrees Celsius. In addition, the exit air temperature from tray 10 may be as high as 75 degrees Celsius. An output temperature may be most easily controlled by locating a temperature sensor at the actual output (or aiming it at the actual output. Such an output temperature may also be controlled or maintained within an acceptable temperature range by placing a temperature sensor at a location away from the output, but where the difference in temperature is adequately predictable.

In the front view of FIG. 1B, one can see power supply 14 located at the back of tray 10, and perforated to permit the flow of air through power supply 14. In addition, one can see hard drive 18*a* located in an area walled off from the heat generating components of tray 10 by wall 26b. As noted above, the power supply 14 could also be situated so as to receive air leaving two different zones on tray 10, with the power supply 14 or other components tuned to maintain certain relative air flow rates from each side.

The side view of FIG. 1C shows more clearly the relationship of the impingement fans 20a, 20b and microprocessors 21a, 21b. The fans 20a, 20b are shown schematically for clarity. Air is pulled through the tops of fans 20a, 20b, and driven down against the top of microprocessors 21a, 21b. This process breaks up layers of warm air that may otherwise form above microprocessors 21a, 21b.

As noted above, other techniques for spot removal of heat from components such as microprocessors 21a, 21b may also be employed. As one example, heat sinks may be attached on top of or to the side of microprocessors 21a, 21b, and may be cooled by circulating air or a liquid, such as water or fluorinert liquid, or oils. Liquid supply and return tubes may be provided down each rack, with taps at which to connect pipes for cooling particular components. Circulation of liquid to the components may be driven by pressure created centrally in the system, e.g., from natural tap water pressure or large pumps, or by small pumps local to a particular tray 10. For example, small peristaltic, centrifugal, vane or gear-rotor pumps may be provided with each tray to create liquid circulation for the tray 10.

Alternatively, a portion of a rack or a component associated with a rack may be cooled, such as by passing liquid through passages in the component. Heat sinks for each heat generating component may then be coupled physically to the cooled component in the rack so as to draw heat out of the components on the tray 10 and into the rack. As one example, a vertical runner on the rack may be provided with clamps into which heat pipes attached to heat-generating components on tray 12 are received, so that the heat pipes may pull heat away from those components and into the runner. The runner may further include fluid passages to carry cooling fluid. Thus, the runner will be kept cool, and will draw heat by conduction from the heat-generating components.

Figure 1E:
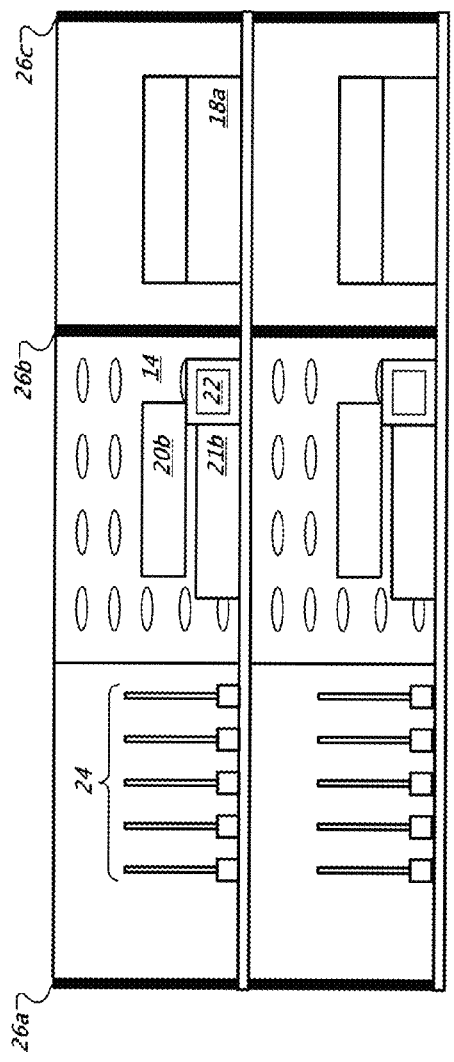
Figure 1F:
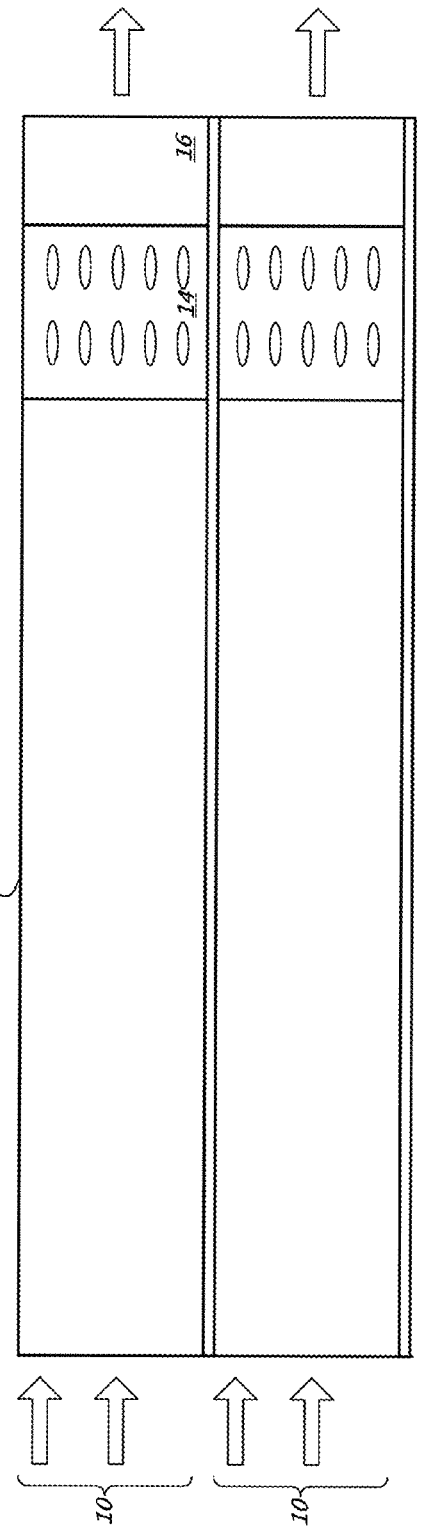

FIG. 1D shows a plan view of a tray in a rack-mount computer system, having dual-zone power supply ventilation. FIG. 1E shows a front view of the tray in FIG. 1D. FIG. 1F shows a side view of the tray in FIG. 1D. The general arrangement of components on the tray 12 here is similar to that in FIGS. 1A-1C, although the particular arrangement and layout of components is not generally critical. However, in these figures, the wall 26b has its rear edge pulled forward from the back wall of the tray 12. Also, the power supply 14 has two areas of openings—one on its front edge, as can be seen in FIG. 1E, and one on its side edge, as can be seen in FIG. 1F. The openings on the front edge generally provide ventilation for the hot side of the tray 12, while those on the side edge provide ventilations for the cool side of the tray 12.

The openings may be sized or otherwise organized to provide particular approximate levels of ventilation to each side of the tray 12. As can be seen in FIGS. 1E and 1F, the front edge of the power supply 1 has more holes than does the edge; in addition, the air flow from the front edge is straight, while air coming in through the side edge needs to curve. As a result, the front edge will provide a higher level of ventilation than will the side edge, and will thus be able to carry away the higher level of heat generated on the hot side of tray 12. The amount of air carried on a hot side might also be lower than on a cool side, such as where equipment requirements force the cool side to stay at a low temperature. In other words, in setting flow rates for each portion of tray 12, both heat generation and desired operating temperature may be taken into account.

Figure 1G:
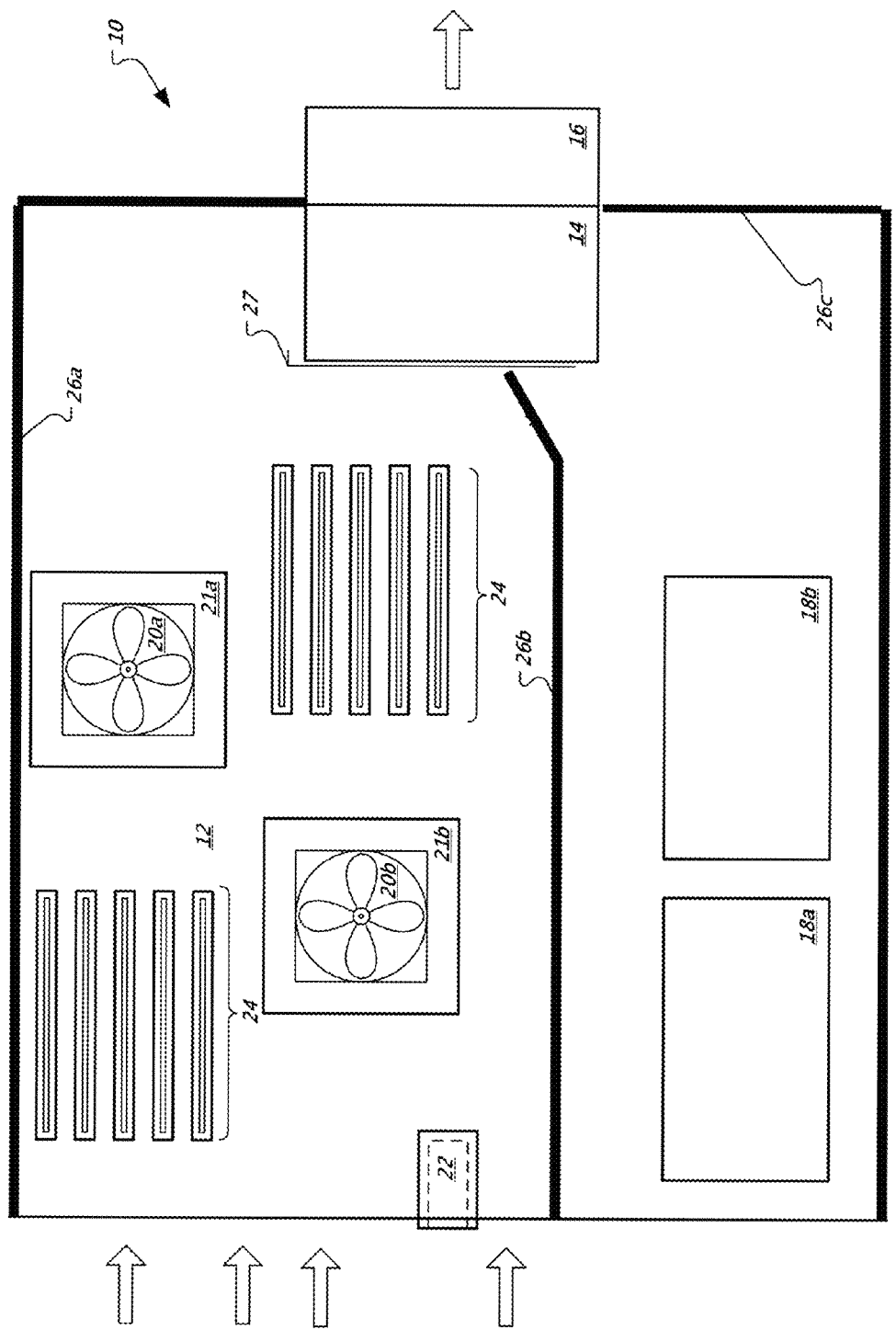
FIG. 1G shows a plan view of an example tray in a rack-mount computer system, having dual-zone adjustable power supply ventilation.

FIG. 1G shows a plan view of a tray in a rack-mount computer system, having dual-zone adjustable power supply ventilation. Here, the wall 26b is positioned to direct a certain amount of ventilating air from each side of wall 26b. The wall 26b may be positioned on tray 12 at an appropriate position, and its terminal end may be made adjustable through pivoting or other mechanisms, so as to permit on-site adjustment of air flow.

In addition, gate 27 may be provided over a front surface of power supply 14 to provide adjustment to the size of openings on the front surface via openings in the gate 27 that form an interference pattern with openings on power supply 27 (much like the openings on certain spice containers). The interference pattern may be different for each side of tray 12, so that moving the gate 27 causes a greater effect on the airflow for one side of tray 12 than it does for the other side of tray 12.

Temperature-dependent mechanisms may also be provided to control the flow of air through power supply 14. For example, polymer or metallic materials that change shape with temperature may be used to form openings that close as their temperature falls—thereby driving back up the exit temperature of air from a particular portion of tray 12. As one example, the materials may produce a form of stoma that opens and closes. Also, mechanisms such as temperature-controlled louvers, or a temperature-controlled actuator on gate 27 may be used to control airflow over board 12. Such air control mechanisms may also be located off of tray 12. For example, a wall perforated by temperature dependent stoma may be placed behind a number of racks filled with trays, and may thereby control the exit temperature for all of the racks in a convenient manner. In such a situation, as in others discussed herein, fan 16 may be eliminated from tray 12, and a central ventilation system may pull air through the various trays and racks.

Figure 2A:
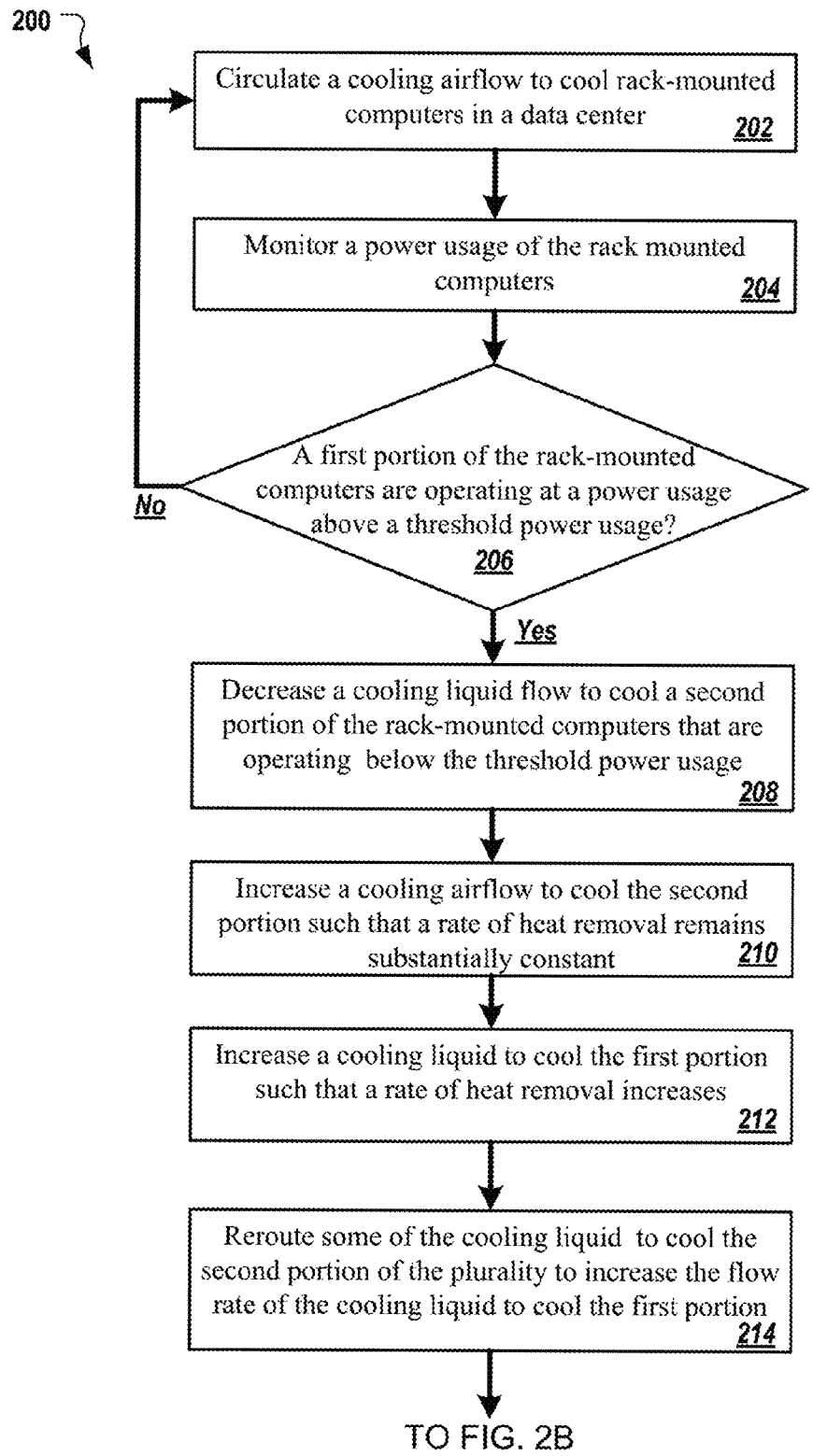
FIGS. 2A-2B illustrate an example method for managing cooling of computing devices in a data center.
Figure 2B:
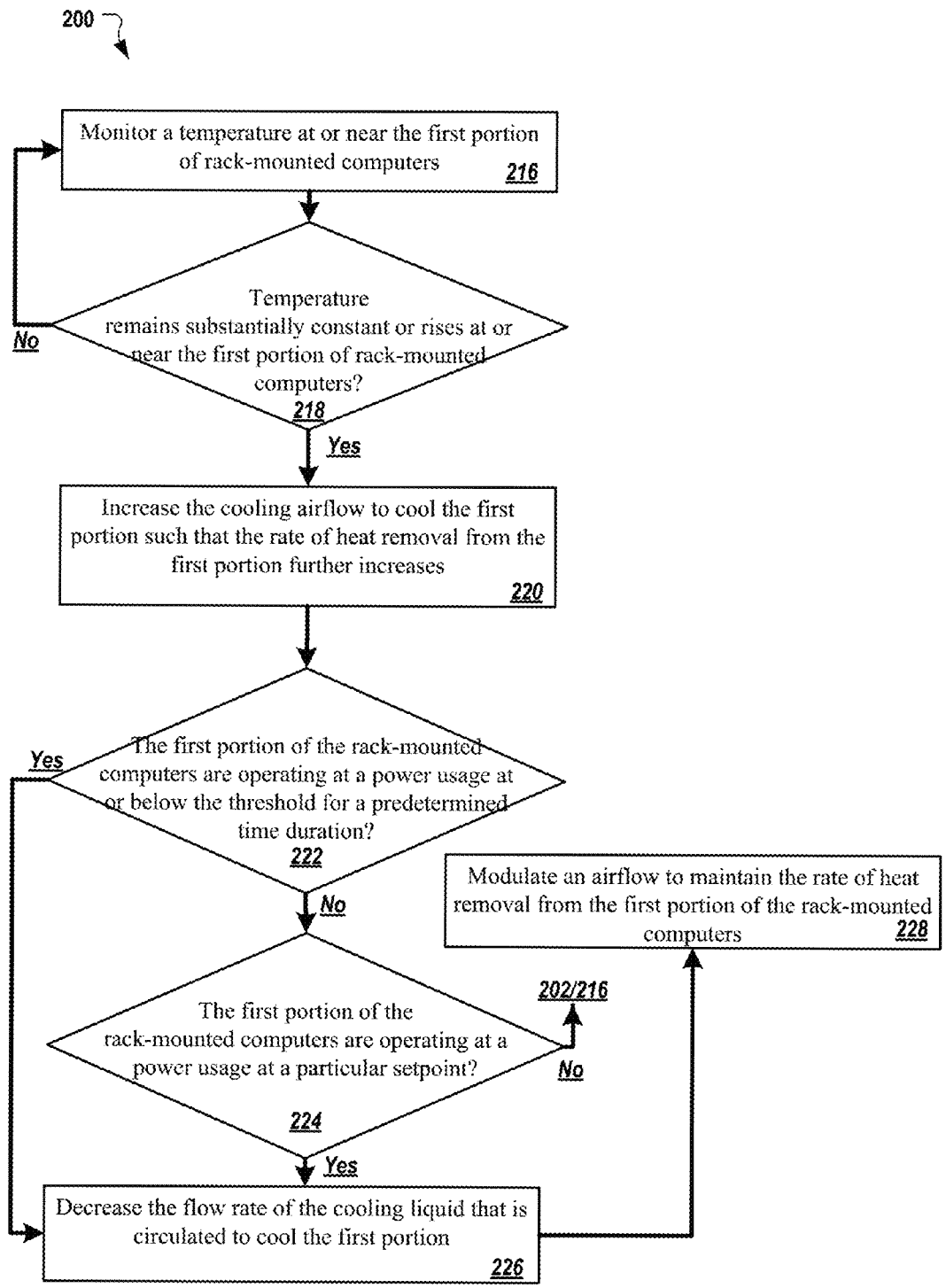

FIGS. 2A-2B illustrate an example method 200 for managing cooling of computing devices in a data center. Method 200 may be implemented, for example, by or with any appropriate cooling system for a data center, such as, the cooling systems, modules, and apparatus described herein (e.g., with reference to FIGS. 3, 4A-4B, and/or 5). In an example implementation, a control system (e.g., control system 503) may implement one or more steps of method 200.

In step 202, a cooling airflow is circulated to cool rack-mounted computers in a data center. The computers may be mounted in racks or trays, such as those illustrated in FIGS. 1A-1G, and in racks as shown, for instance, in FIGS. 3, 4A-4B, or 5, to name a few implementations. The airflow may be circulated, for example, by fans that are mounted on the trays or racks, or by fans of cooling modules positioned between racks (e.g., FIG. 3), or by other fans in a data center cooling system. In some implementations, the cooling airflow may be determined according to an amount of heat generated by the computers during operation. This amount of heat is dissipated, for example, through the cooling airflow and, eventually, to ambient air, such as through a cooling liquid circulated through cooling coils arranged to capture the airflow heated by the computers. In some instances, one or more cooling plants are sized to remove the computer-generated heat (e.g., by chillers, cooling towers, evaporative coolers, or a combination thereof). In some implementations, although all of the computers in the data center may generate a particular amount of heat to be removed when each computer is operating at its highest power draw (e.g., highest utilization), the one or more cooling plants may not have enough cooling capacity to dissipate that amount of heat. For instance, the cooling plant(s) may be sized to dissipate an amount of heat generated by the rack-mounted computers (and other loads) when each computer is operating at an average power draw or utilization (or some combination of computers operating at particular power loads, and still other computers operating a different power loads). In some aspects, additional computers may be added to the data center (e.g., in one, two, or more deployments beyond an initial number of computers installed in the data center) even though the one or more cooling plants may not have enough cooling capacity to dissipate the amount of heat generated by the initial number of computers in the data center.

Figure 3:
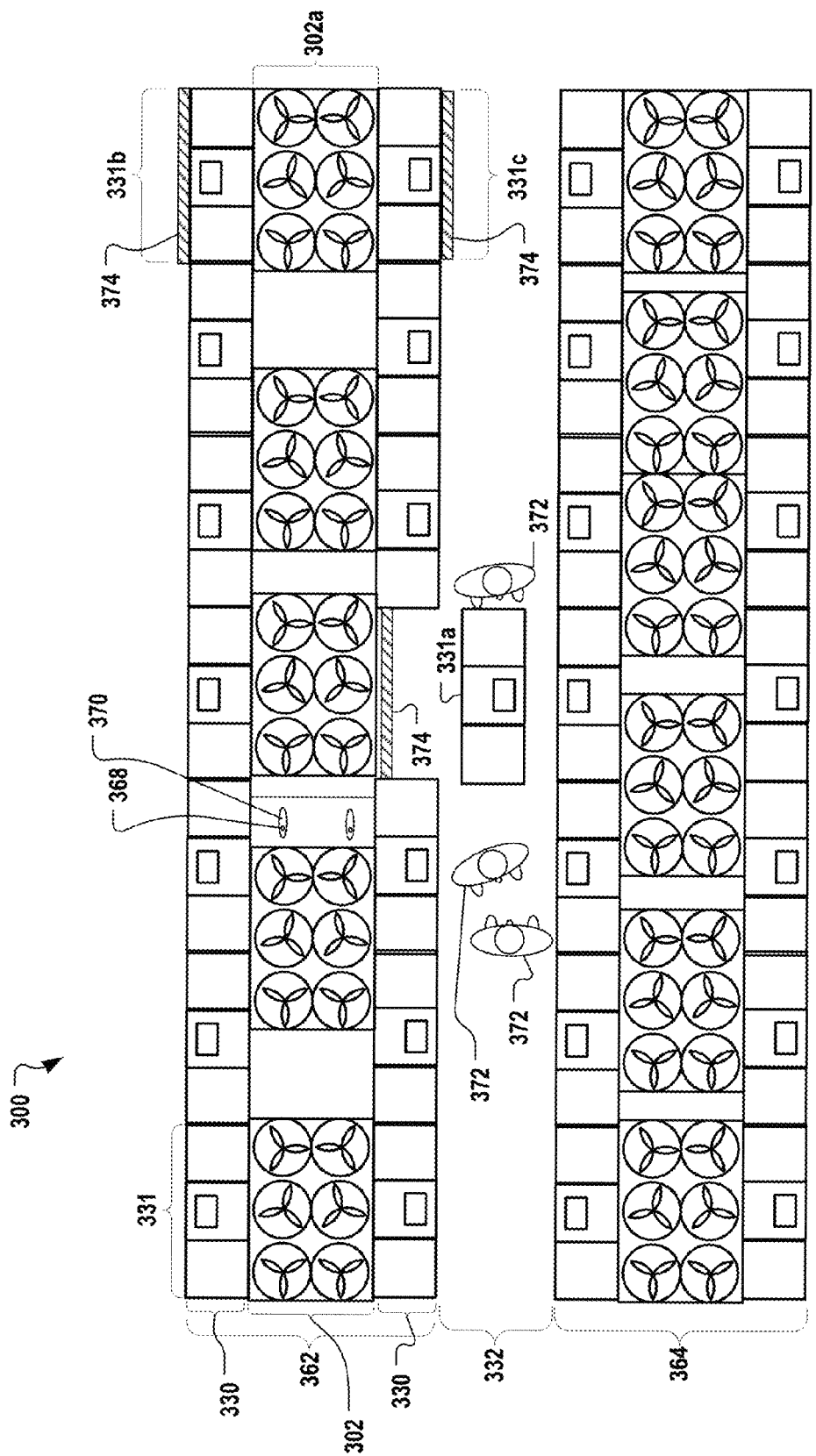
FIG. 3 shows a plan view of two rows in a computer data center with cooling units arranged between racks situated in the rows.
Figure 4A:
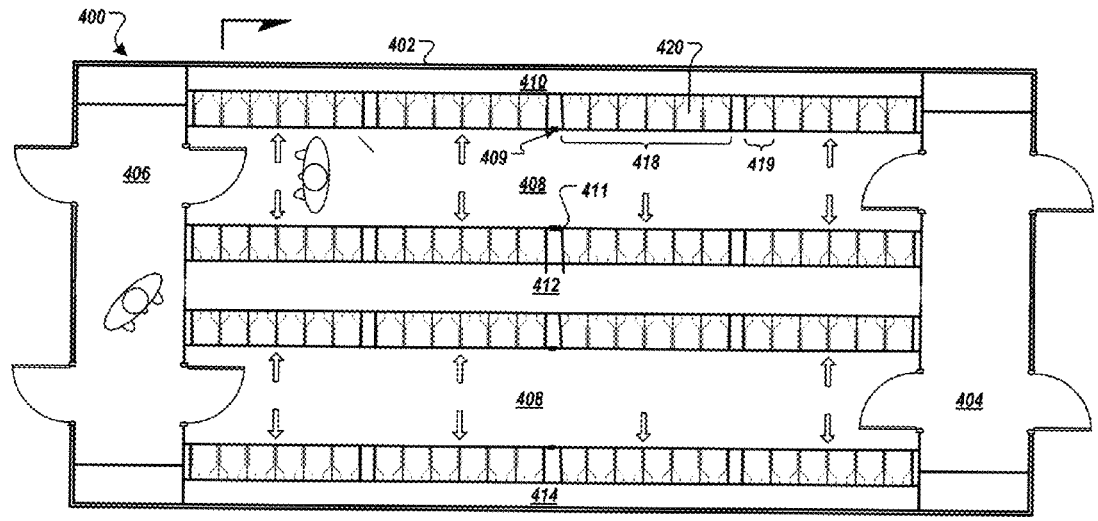
FIGS. 4A-4B show plan and sectional views, respectively, of a modular data center system.
Figure 4B:
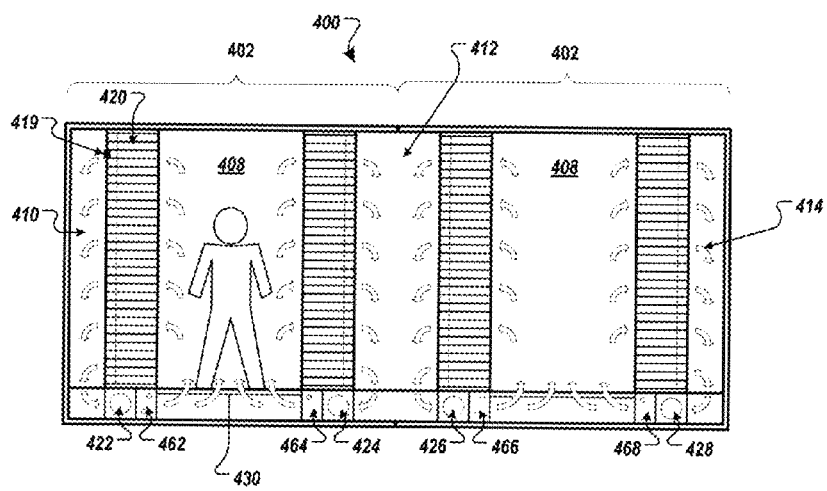
Figure 5:
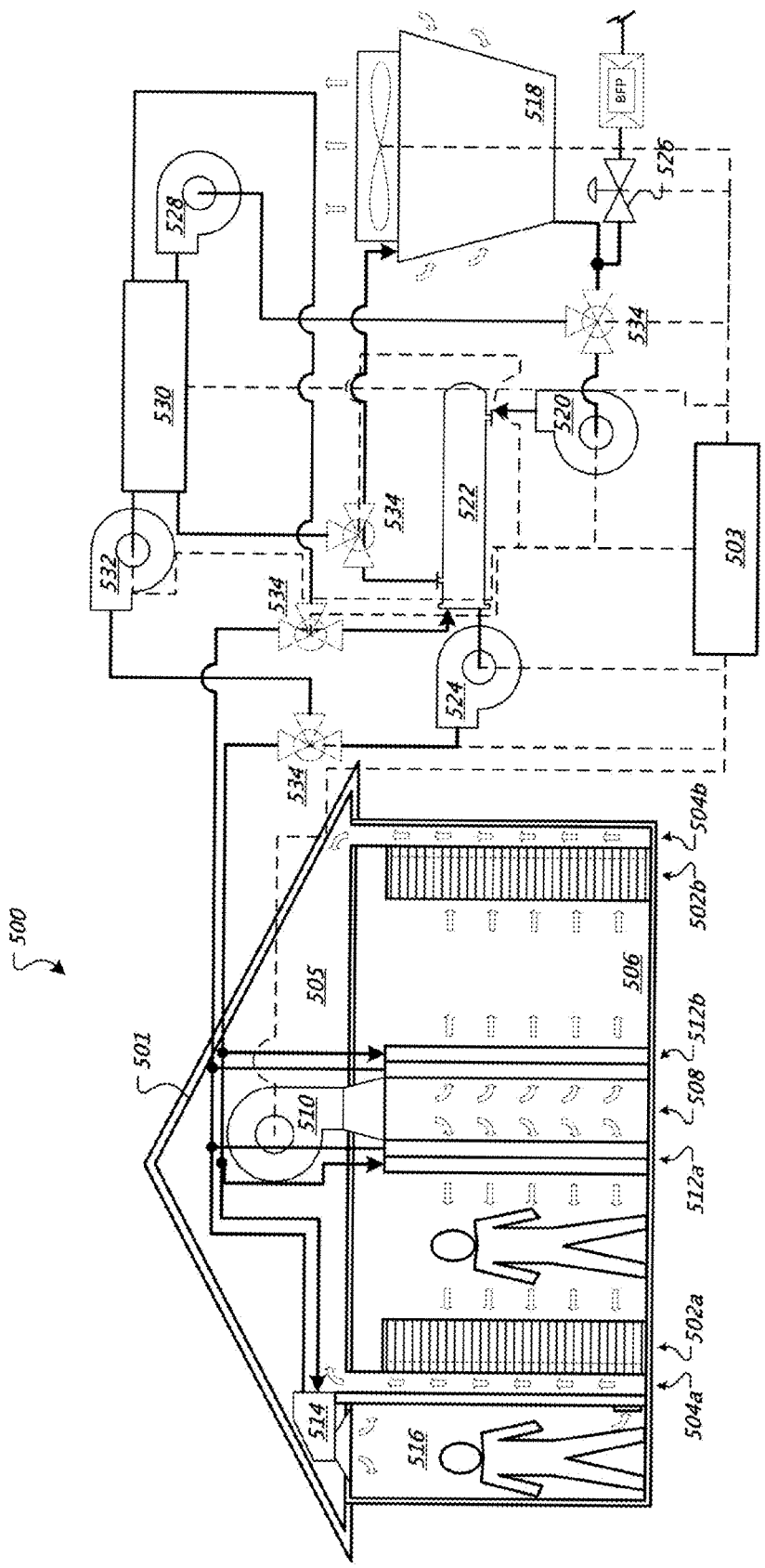
FIG. 5 illustrates a schematic diagram showing an example system for cooling a computer data center.
Figure 6:
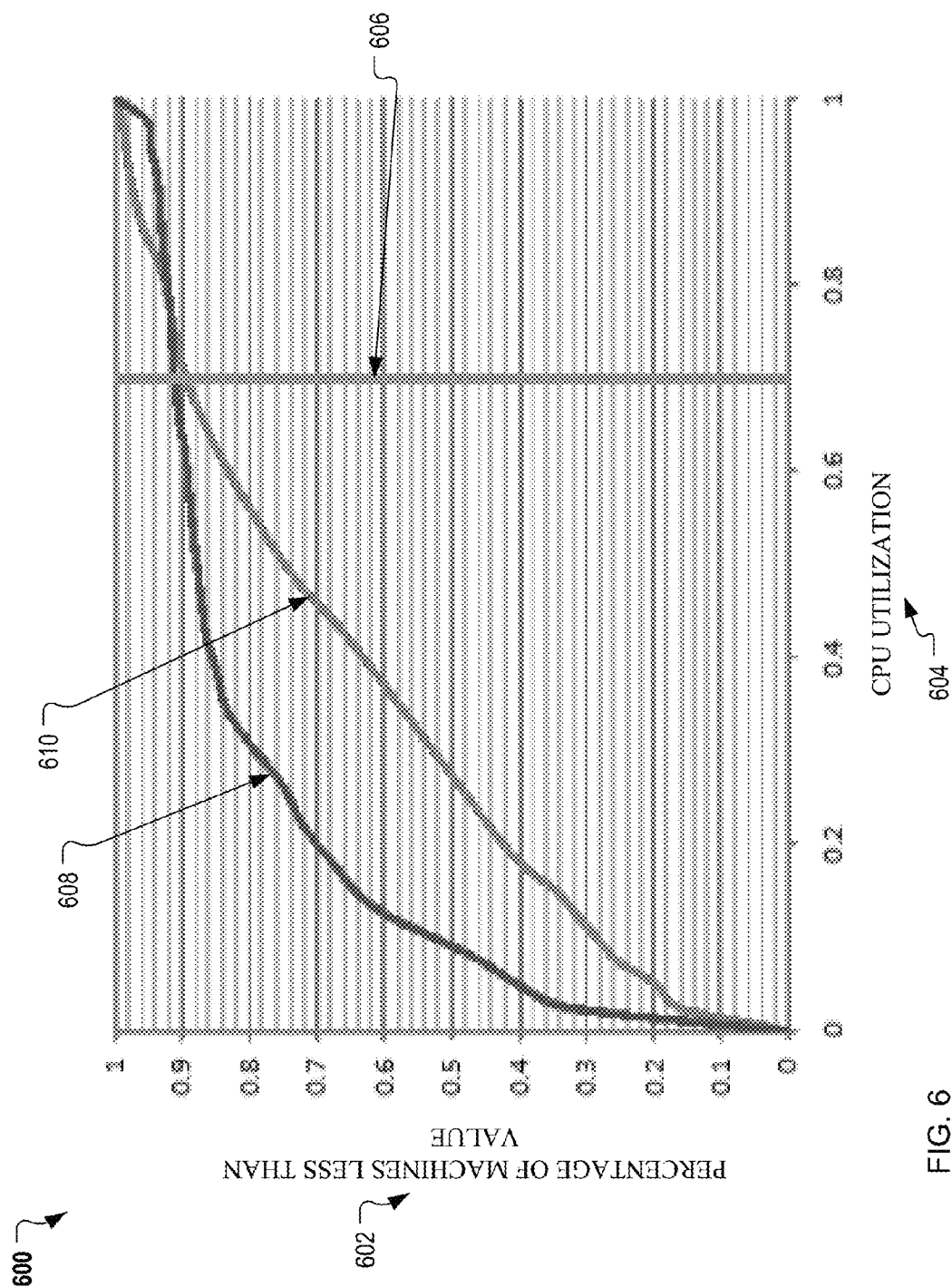
FIG. 6 illustrates a distribution function of machine utilization in a data center that includes multiple rack-mounted computers.

Turning to FIG. 6, this figure illustrates graph 600 that shows a distribution function of machine utilization in a data center that includes multiple rack-mounted computers. As illustrated, the graph 600 includes a y-axis that represents a percentage of machines (e.g., computers, servers, CPUs) that are operating at a utilization less than a particular threshold value 606. Here, the threshold value 606 is set at about 0.7, or 70%, utilization of a maximum utilization. The x-axis 604 represents machine (e.g., CPU) utilization percentage of maximum (e.g., 1.0 or 100%). Graph 600 shows two distribution curves that, for example, may represent two different types of cooling modules deployed in a data center to cool the rack-mounted computers. For example, in some aspects, one or both of the distribution curves 608 and 610 may represent variations of cooling modules as shown in FIG. 3 (e.g., cooling modules 302). In another aspect, one of the distribution curves 608 and 610 may represent variations of cooling systems as shown in FIGS. 4A-4B and 5, as well as FIG. 3.

As illustrated, the distribution curves 608 and 610 both illustrate a distribution in which about 10% of the machines are operating above the threshold 606. Thus, as shown, the other 90% of the machines may be adjusted to operate at a more efficient state (e.g., by increasing cooling to such machines). Further, if the 10% of machines that are operating at or above the threshold 606, additional cooling (e.g., cooling liquid) may be re-routed from some of the cooling modules that serve the 90% of the machines to cooling modules that serve the 10% of the machines. This may be because, as described herein, the data center may have a cooling liquid (e.g., chilled water) supply volume that is less than what may be required to cool all the machines operating at 100% utilization, but may have an excess cooling airflow capacity in the data center.

As illustrated, the difference in the distribution curves 608 and 610 is that, for the distribution curve 608, a higher percentage of machines are operating at a utilization less than the value of the x-axis 604. Thus, the curve 608 may show more machines are operating at more efficient (e.g., lower utilization) operating points as compared to the curve 610.

In step 204, the power usage of the rack-mounted computers is monitored (e.g., for a rack, a row of racks, each individual computer, or some other measure of computers in the data center). In some aspects, processor frequency or computer utilization (e.g., CPU utilization) is monitored, for example, as a proxy for power load.

In step 206, a determination is made whether a first portion of the rack-mounted computers are operating at a power usage above a threshold power usage. If no, then method 200 may, in the illustrated example, return to step 200. If yes, then in step 208, a cooling liquid flow (e.g., chilled or cool water, glycol, or other liquid) that is used to cool a second portion of the rack-mounted computers that are operating below the threshold power usage is decreased. In some aspects, decreasing the flow may include, for instance, modulating one or more control valves, turning off one or more pumps, modulating one or more variable frequency (speed) drives that control pumps used to circulate the cooling liquid, or other actions. In some aspects, the cooling liquid flow that is decreased is routed to cooling modules (e.g., fan coil units) that are positioned to cool the rack-mounted computer.

In step 210, a cooling airflow to cool the second portion of computers is increased such that a rate of heat removal from the second portion of computers remains substantially constant. In some aspects, increasing the airflow may include turning on additional rack-mounted (or tray mounted) fans, speeding up such fans, modulating fans that are part of cooling modules positioned to cool the computers, or other action. Heat removal may remain substantially constant because, as cooling liquid flow rate decreases, the flow of liquid to cool the second portion of computers has less cooling capacity. To account for this loss, more cooling airflow may be circulated to keep a particular temperature difference (or leaving air temperature) across (or from) the cooling module.

In step 212, a cooling liquid circulated to cool the first portion is increased in flow rate, such that a rate of heat removal from the first portion of computers increases (or does not decrease). In some aspects, even though portions of the rack-mounted computers, such as the first portion, may be operating above a threshold, many other computers (such as the second portion) may be operating below the threshold power usage or utilization. Cooling modules positioned to cool the second portion of computers may, therefore, have excess capacity (e.g., excess airflow). Such excess airflow, however, may not be easily redirected (e.g., across the data center) to provide extra cooling for the first portion of computers (e.g., computers operating above the threshold). Moreover, there may not be an excess of cooling liquid (e.g., chilled water) in the data center.

In step 214, some of the cooling liquid used to cool the second portion of the plurality is rerouted to increase the flow rate of the cooling liquid to cool the first portion of computers. Thus, by decreasing a flow of cooling liquid from computers that are operating below a threshold power usage (and making up the difference by increasing an airflow or just allowing such computers to heat up), more cooling liquid can be circulated to computers that are operating above the threshold.

Turning now to FIG. 2B, in step 216, a temperature at or near the first portion of rack-mounted computers is monitored (e.g., by temperature sensors of a control system). In some aspects, the temperature may be sensed on the racks that support the second portion of computers. In other aspects, the temperature may be sensed in a warm air plenum that is positioned on a back side of the racks (e.g., in between the racks and cooling coils of one or more cooling modules).

In step 218, a determination is made whether the sensed temperature remains substantially constant or rises at or near the first portion of rack-mounted computers. If the temperature falls, it may be continually monitored in step 216. If the temperature does rise or remain substantially constant, then, in step 220, the cooling airflow circulated to cool the first portion of rack-mounted computers may be increased such that the rate of heat removal from the first portion of rack-mounted computers further increases.

In step 222, a determination is made whether the first portion of the rack-mounted computers are operating at a power usage at or below the threshold for a predetermined time duration (e.g., if the power usage has decreased below the threshold for a specific time period). If no, then a determination is made, in step 224, whether the first portion of the rack-mounted computers are operating at a power usage at a particular setpoint below the threshold (e.g., if the power usage has decreased much below the threshold for even a short period of time).

If the determination in either of steps 222 or 224 is yes, then, in step 226, the flow rate of the cooling liquid that is circulated to cool the first portion of rack-mounted computers is decreased. In step 228, an airflow circulated to the first portion of the rack-mounted computers is modulated to maintain the rate of heat removal from the first portion of the rack-mounted computers. For example, as the flow rate of cooling fluid is decreased (e.g., because the computers have decreased in power usage or utilization), the airflow may also be decreased.

FIG. 3 shows a plan view of two rows 362 and 364, respectively, in a computer data center 300 with cooling units 302 arranged between racks situated in the rows. In some implementations, the data center 300 may implement one or more of the computer performance management control schemes discussed herein. In general, this figure illustrates certain levels of density and flexibility that may be achieved with structures like those discussed above. Each of the rows 362, 364 is made up of a row of cooling units 302 sandwiched by two rows 330 of computing racks 331. In some implementations, a row may also be provided with a single row of computer racks, such as by pushing the cooling units up against a wall of a data center, providing blanking panels all across one side of a cooling unit row, or by providing cooling units that only have openings on one side.

Each of the rows of computer racks and rows of cooling units in each of rows 362, 364 may have a certain cooling unit density. In particular, a certain number of such computing or cooling units may repeat over a certain length of a row such as over 100 feet. Or, expressed in another way, each of the cooling units may repeat once every X feet in a row.

In this example, each of the rows is approximately 40 feet long. Each of the three-bay racks is approximately six feet long. And each of the cooling units is slightly longer than each of the racks. Thus, for example, if each rack were exactly six feet long and all of the racks were adjoining, the rack cooling units would repeat every six feet. As a result, the racks could be said to have a six-foot "pitch."

As can be seen, the pitch for the cooling unit rows is different in row 362 than in row 364. Row 362 contains five cooling units 302, while row 364 contains six cooling units 302. Thus, if one assumes that the total length of each row is 42 feet, then the pitch of cooling units in row 364 would be 7 feet, 42/6, and the pitch of cooling units in row 362 would be 8.4 feet, 42/5.

The pitch of the cooling units and of the computer racks may differ, and the respective lengths of the two kinds of apparatuses may differ, because warm air is able to flow up and down the rows 330. Thus, for example, a bay or rack may exhaust warm air in an area in which there is no cooling unit to receive it. But that warm air may be drawn laterally down the row and into an adjacent module, where it is cooled and circulated back into the work space, such as aisle 332.

Row 362 may receive less cooling air than would row 364. However, it is possible that row 362 needs less cooling, so that the particular number of cooling units in each row has been calculated to match the expected cooling requirements. For example, row 362 may be outfitted with trays holding new, low-power microprocessors; row 362 may contain more storage trays, which are generally lower power than processor trays, and fewer processor trays; or row 362 may generally be assigned less computationally intensive work than is row 364.

In addition, the two rows 362 and 364 may both have had an equal number of cooling units at one time, but then an operator of the data center may have determined that row 362 did not need as many modules to operate effectively. As a result, the operator may have removed one of the modules so that it could be used elsewhere.

The particular density of cooling units that is required may be computed by first computing the heat output of computer racks on both sides of an entire row. The amount of cooling provided by one cooling unit may be known, and may be divided into the total computed heat load and rounded up to get the number of required cooling units. Those cooling units may then be spaced along a row so as to be as equally spaced as practical, or to match the location of the heat load as closely as practical, such as where certain computer racks in the row generate more heat than do others. Also, as explained in more detail below, the row of cooling units may be aligned with rows of support columns in a facility, and the cooling units may be spaced along the row so as to avoid hitting any columns.

Where there is space between cooling units, a blanking panel 368 may be used to block the space so that air from the warm air capture plenum does not escape upward into the work space. The panel 368 may simply take the form of a paired set of sheet metal sheets that slide relative to each other along slots 370 in one of the sheets, and can be fixed in location by tightening a connector onto the slots.

FIG. 3 also shows a rack 331a being removed for maintenance or replacement. The rack 331a may be mounted on caster wheels so that one of technicians 372 could pull it forward into aisle 332 and then roll it away. In the figure, a blanking panel 374 has been placed over an opening left by the removal of rack 331a to prevent air from the work space from being pulled into the warm air capture plenum, or to prevent warm air from the plenum from mixing into the work space. The blanking panel 374 may be a solid panel, a flexible sheet, or may take any other appropriate form.

In one implementation, a space may be laid out with cooling units mounted side-to-side for maximum density, but half of the cooling units may be omitted upon installation, e.g., so that there is 50% coverage. Such an arrangement may adequately match the cooling unit capacity, e.g., about four racks per cooling unit, where the racks are approximately the same length as the cooling units and mounted back-to-back on the cooling units, to the heat load of the racks. Where higher powered racks are used, the cooling units may be moved closer to each other to adapt for the higher heat load, e.g., if rack spacing is limited by maximum cable lengths, or the racks may be spaced from each other sufficiently so that the cooling units do not need to be moved. In this way, flexibility may be achieved by altering the rack pitch or by altering the cooling unit pitch.

FIGS. 4A-4B show plan and sectional views, respectively, of a modular data center system. In some implementations, one or more data processing centers 400 may implement one or more of the computer performance management control schemes discussed herein. The system may include one of more data processing centers 400 in shipping containers 402. Although not shown to scale in the figure, each shipping container 402 may be approximately 40 feet along, 8 feet wide, and 9.5 feet tall, e.g., a 1AAA shipping container. In other implementations, the shipping container can have different dimensions, e.g., the shipping container can be a 1CC shipping container. Such containers may be employed as part of a rapid deployment data center.

Each container 402 includes side panels that are designed to be removed. Each container 402 also includes equipment designed to enable the container to be fully connected with an adjacent container. Such connections enable common access to the equipment in multiple attached containers, a common environment, and an enclosed environmental space.

Each container 402 may include vestibules 404 and 406 at each end of the relevant container 402. When multiple containers are connected to each other, these vestibules provide access across the containers. One or more patch panels or other networking components to permit for the operation of data processing center 400 may also be located in vestibules 404 and 406. In addition, vestibules 404 and 406 may contain connections and controls for the shipping container. For example, cooling pipes, e.g., from heat exchangers that provide cooling water that has been cooled by water supplied from a source of cooling such as a cooling tower, may pass through the end walls of a container, and may be provided with shut-off valves in the vestibules 404 and 406 to permit for simplified connection of the data center to, for example, cooling water piping. Also, switching equipment may be located in the vestibules 404 and 406 to control equipment in the container 402. The vestibules 404 and 406 may also include connections and controls for attaching multiple containers 402 together. As one example, the connections may enable a single external cooling water connection, while the internal cooling lines are attached together via connections accessible in vestibules 404 and 406. Other utilities may be linkable in the same manner.

Central workspaces 408 may be defined down the middle of shipping containers 402 as aisles in which engineers, technicians, and other workers may move when maintaining and monitoring the data processing center 400. For example, workspaces 408 may provide room in which workers may remove trays from racks and replace them with new trays. In general, each workspace 408 is sized to permit for free movement by workers and to permit manipulation of the various components in data processing center 400, including providing space to slide trays out of their racks comfortably. When multiple containers 402 are joined, the workspaces 408 may generally be accessed from vestibules 404 and 406.

A number of racks such as rack 419 may be arrayed on each side of a workspace 408. Each rack may hold several dozen trays, like tray 420, on which are mounted various computer components. The trays may simply be held into position on ledges in each rack, and may be stacked one over the other. Individual trays may be removed from a rack, or an entire rack may be moved into a workspace 408.

The racks may be arranged into a number of bays such as bay 418. In the figure, each bay includes six racks and may be approximately 8 feet wide. The container 402 includes four bays on each side of each workspace 408. Space may be provided between adjacent bays to provide access between the bays, and to provide space for mounting controls or other components associated with each bay. Various other arrangements for racks and bays may also be employed as appropriate.

Warm air plenums 410 and 414 are located behind the racks and along the exterior walls of the shipping container 402. A larger joint warm air plenum 412 is formed where the two shipping containers are connected. The warm air plenums receive air that has been pulled over trays, such as tray 420, from workspace 408. The air movement may be created by fans located on the racks, in the floor, or in other locations. For example, if fans are located on the trays and each of the fans on the associated trays is controlled to exhaust air at one temperature, such as 40° C., 42.5° C., 45° C., 47.5° C., 50° C., 52.5° C., 55° C., or 57.5° C., the air in plenums 410, 412, and 414 will generally be a single temperature or almost a single temperature. As a result, there may be little need for blending or mixing of air in warm air plenums 410, 412, and 414. Alternatively, if fans in the floor are used, there will be a greater degree temperature variation from air flowing over the racks, and greater degree of mingling of air in the plenums 410, 412, and 414 to help maintain a consistent temperature profile.

FIG. 4B shows a sectional view of the data center from FIG. 4A. This figure more clearly shows the relationship and airflow between workspaces 408 and warm air plenums 410, 412, and 414. In particular, air is drawn across trays, such as tray 420, by fans at the back of the trays 419. Although individual fans associated with single trays or a small number of trays, other arrangements of fans may also be provided. For example, larger fans or blowers, may be provided to serve more than one tray, to serve a rack or group or racks, or may be installed in the floor, in the plenum space, or other location.

Air may be drawn out of warm air plenums 410, 412, and 414 by fans 422, 424, 426, and 428. Fans 422, 424, 426, and 428 may take various forms. In one exemplary implementation, the may be in the form of a number of squirrel cage fans. The fans may be located along the length of container 402, and below the racks, as shown in FIG. 4B. A number of fans may be associated with each fan motor, so that groups of fans may be swapped out if there is a failure of a motor or fan. Although not shown, each fan or a group of fans may be communicably coupled to a controller, e.g., an actuator, so as to control a speed of the fan(s).

An elevated floor 430 may be provided at or near the bottom of the racks, on which workers in workspaces 408 may stand. The elevated floor 430 may be formed of a perforated material, of a grating, or of mesh material that permits air from fans 422 and 424 to flow into workspaces 408. Various forms of industrial flooring and platform materials may be used to produce a suitable floor that has low pressure losses.

Fans 422, 424, 426, and 428 may blow heated air from warm air plenums 410, 412, and 414 through cooling coils 462, 464, 466, and 468. The cooling coils may be sized using well known techniques, and may be standard coils in the form of air-to-water heat exchangers providing a low air pressure drop, such as a 0.5 inch pressure drop. Cooling water may be provided to the cooling coils at a temperature, for example, of 10, 15, or 20 degrees Celsius, and may be returned from cooling coils at a temperature of 20, 25, 30, 35, or 40 degrees Celsius. In other implementations, cooling water may be supplied at 15, 10, or 20 degrees Celsius, and may be returned at temperatures of about 25 degrees Celsius, 30 degrees Celsius, 35 degrees Celsius, 45 degrees Celsius, 50 degrees Celsius, or higher temperatures. The position of the fans 422, 424, 426, and 428 and the coils 462, 464, 466, and 468 may also be reversed, so as to give easier access to the fans for maintenance and replacement. In such an arrangement, the fans will draw air through the cooling coils.

The particular supply and return temperatures may be selected as a parameter or boundary condition for the system, or may be a variable that depends on other parameters of the system. Likewise, the supply or return temperature may be monitored and used as a control input for the system, or may be left to range freely as a dependent variable of other parameters in the system. For example, the temperature in workspaces 408 may be set, as may the temperature of air entering plenums 410, 412, and 414. The flow rate of cooling water and/or the temperature of the cooling water may then vary based on the amount of cooling needed to maintain those set temperatures.

The particular positioning of components in shipping container 402 may be altered to meet particular needs. For example, the location of fans and cooling coils may be changed to provide for fewer changes in the direction of airflow or to grant easier access for maintenance, such as to clean or replace coils or fan motors. Appropriate techniques may also be used to lessen the noise created in workspace 408 by fans. For example, placing coils in front of the fans may help to deaden noise created by the fans. Also, selection of materials and the layout of components may be made to lessen pressure drop so as to permit for quieter operation of fans, including by permitting lower rotational speeds of the fans. The equipment may also be positioned to enable easy access to connect one container to another, and also to disconnect them later. Utilities and other services may also be positioned to enable easy access and connections between containers 402.

Airflow in warm air plenums 410, 412, and 414 may be controlled via pressure sensors. For example, the fans may be controlled so that the pressure in warm air plenums is roughly equal to the pressure in workspaces 408. Taps for the pressure sensors may be placed in any appropriate location for approximating a pressure differential across the trays 420. For example, one tap may be placed in a central portion of plenum 412, while another may be placed on the workspace 408 side of a wall separating plenum 412 from workspace 408. For example the sensors may be operated in a conventional manner with a control system to control the operation of fans 422, 424, 426, and 428. One sensor may be provided in each plenum, and the fans for a plenum or a portion of a plenum may be ganged on a single control point.

For operations, the system may better isolate problems in one area from other components. For instance, if a particular rack has trays that are outputting very warm air, such action will not affect a pressure sensor in the plenum, even if the fans on the rack are running at high speed, because pressure differences quickly dissipate, and the air will be drawn out of the plenum with other cooler air. The air of varying temperature will ultimately be mixed adequately in the plenum, in a workspace, or in an area between the plenum and the workspace.

FIG. 5 illustrates a schematic diagram showing an example system 500 for cooling a computer data center 501. In some implementations, the example system 500 may implement one or more of the computer performance management control schemes discussed herein. The system 500 generally includes an air handling unit (including, e.g., fan 510 and cooling coils 512a, 512b) in the data center 501 for transferring heat from the data center's air to cooling water, a heat exchanger 522 for removing heat from the cooling water and passing it to cooling tower water, and a cooling tower 518 to pass the accumulated heat to the ambient air through evaporation and cooling of the cooling tower water. In general operation, the system 500 may be run from the cooling tower/heat exchanger/cooling coil system, though a powered refrigeration system such as a chiller may be provided for peak loads, such as when the outdoor ambient dew point is very high and the cooling tower cannot provide sufficient cooling alone. As explained below, control parameters for the system may also be set so as to avoid most or any need for the use of chillers or other such items.

The temperatures of each portion of the system 500 are selected to be relatively high, so as to permit more efficient operation of the system 500, than if the temperatures were lower. For example, relatively high air temperatures in the system, e.g., air entering a cooling coil over 110° F. (43.3° C.) and exiting temperature above 70° F. (43.34° C.), may in turn permit for relatively high cooling water temperatures, e.g., water entering a cooling coil around 68° F. (20° C.) and exiting around 104° F. (40° C.), because the amount of heat that can be taken out of the air is generally proportional to the difference in temperature between the water and the air. If the difference can be kept at an acceptable level, where the temperatures are high enough that evaporative cooling, e.g., cooling through a cooling tower, without further cooling via chiller, is sufficient, the relatively high electrical cost of operating a chiller (or many chillers) may be avoided.

High system temperatures may be particularly advantageous in certain implementations when hybrid cooling towers are used. Such hybrid cooling towers combine the functionality of an ordinary cooling tower with a water-to-water heat exchanger. Sufficiently high chosen temperature setpoints may allow the hybrid tower to provide substantial cooling capacity, even when operating in a water-to-air mode without utility water. As a result, a hybrid cooling tower may be used to provide cooling capacity to a facility relatively quickly, even before utility water may be obtained in large volumes. The capacity of the cooling tower may be directly related to the difference in the temperature of the water within it to the ambient outside air.

When the difference in temperatures is not very large, a change of only a few degrees can bring substantial gains in efficiency. For example, where the cooling water enters at 68° F. (20° C.), by heating air to 113° F. (45° C.) rather than 104° F. (40° C.), the temperature difference is increased from 68° F. to 77° F. (36° C. to 45° C.)—which may result in an increase in heat flow of 25 percent. The actual difference will vary slightly, as the entering conditions for air and water are not the only conditions (because the air cools as it passes through a cooling cool, and the water warms); this example, however, indicates how the difference in temperature can affect efficiency of a system.

Use of elevated temperatures in a system may also prevent air in or around the system from falling below its liquid saturation point, i.e., its dew point, and condensing. This may, in certain circumstances, provide benefits both in efficiency and in operations of the system. Efficiency benefits may be obtained because creating condensation requires much more energy than simply cooling air, so that systems creating condensation may use a large amount of electricity or other energy. Improvements in operations of the system may occur because, if pipes in the system carry water that is below the saturation temperature of the air around the pipes, condensation might form on the pipes. That condensation can damage the pipes or equipment in the conditioned space, cause mold, and cause water to pool on the floor, and can require the installation of insulation on the pipes (to stop the condensation).

In the system shown in FIG. 5, use of elevated temperatures may substantially reduce, or almost entirely eliminate, the need for energy-intensive cooling components such as chillers and the like, even where the heat load in the data center 501 is very high. As a result, system 500 may be operated at a lower operating cost than could otherwise be achieved. In addition, lower capital costs may be required, because fans, coils, heat exchangers, and cooling towers are relatively basic and inexpensive components. In addition, by operating with a higher temperature difference between cooled air and cooling water, less volume of cooling water is needed, thus reducing the size and cost of piping, and the cost to operate pumps and other such components.

In addition, those components are often very standardized, so that their acquisition costs are lower, and they are more easily located, particularly in developing countries and remote areas where it may be beneficial to place a data center 501. Use of system 500 in remote areas and other areas with limited access to electrical power is also helped by the fact that system 500 may be operated using less electrical power. As a result, such a system can be located near lower-power electrical sub-stations and the like. As discussed more completely below, lower-powered systems may also be amenable to being implemented as self-powered systems using energy sources such as solar, wind, natural-gas powered turbines, fuel cells, and the like.

Referring now to FIG. 5, there is shown a data center 501 in sectional view, which as shown, is a building that houses a large number of computers or similar heat-generating electronic components. A workspace 506 is defined around the computers, which are arranged in a number of parallel rows and mounted in vertical racks, such as racks 502a, 502b. The racks may include pairs of vertical rails to which are attached paired mounting brackets (not shown). Trays containing computers, such as standard circuit boards in the form of motherboards, may be placed on the mounting brackets.

In one example, the mounting brackets may be angled rails welded or otherwise adhered to vertical rails in the frame of a rack, and trays may include motherboards that are slid into place on top of the brackets, similar to the manner in which food trays are slid onto storage racks in a cafeteria, or bread trays are slid into bread racks. The trays may be spaced closely together to maximize the number of trays in a data center, but sufficiently far apart to contain all the components on the trays and to permit air circulation between the trays.

Other arrangements may also be used. For example, trays may be mounted vertically in groups, such as in the form of computer blades. The trays may simply rest in a rack and be electrically connected after they are slid into place, or they may be provided with mechanisms, such as electrical traces along one edge, that create electrical and data connections when they are slid into place.

Air may circulate from workspace 506 across the trays and into warm-air plenums 504a, 504b behind the trays. The air may be drawn into the trays by fans mounted at the back of the trays (not shown). The fans may be programmed or otherwise configured to maintain a set exhaust temperature for the air into the warm air plenum, and may also be programmed or otherwise configured to maintain a particular temperature rise across the trays. Where the temperature of the air in the work space 506 is known, controlling the exhaust temperature also indirectly controls the temperature rise. The work space 506 may, in certain circumstances, be referenced as a "cold aisle," and the plenums 504a, 504b as "warm aisles."

The temperature rise can be large. For example, the work space 506 temperature may be about 77° F. (25° C.) and the exhaust temperature into the warm-air plenums 504a, 504b may be set to 113° F. (45° C.), for a 36° F. (20° C.)) rise in temperature. The exhaust temperature may also be as much as 212° F. (100° C.) where the heat generating equipment can operate at such elevated temperature. For example, the temperature of the air exiting the equipment and entering the warm-air plenum may be 118.4, 122, 129.2, 136.4, 143.6, 150.8, 158, 165, 172.4, 179.6, 186.8, 194, 201, or 208.4° F. (48, 50, 54, 58, 62, 66, 70, 74, 78, 82, 86, 90, 94, or 98° C.). Such a high exhaust temperature generally runs contrary to teachings that cooling of heat-generating electronic equipment is best conducted by washing the equipment with large amounts of fast-moving, cool air. Such a cool-air approach does cool the equipment, but it also uses lots of energy.

Cooling of particular electronic equipment, such as microprocessors, may be improved even where the flow of air across the trays is slow, by attaching impingement fans to the tops of the microprocessors or other particularly warm components, or by providing heat pipes and related heat exchangers for such components.

The heated air may be routed upward into a ceiling area, or attic 505, or into a raised floor or basement, or other appropriate space, and may be gathered there by air handling units that include, for example, fan 510, which may include, for example, one or more centrifugal fans appropriately sized for the task. The fan 510 may then deliver the air back into a plenum 508 located adjacent to the workspace 506. The plenum 508 may be simply a bay-sized area in the middle of a row of racks, that has been left empty of racks, and that has been isolated from any warm-air plenums on either side of it, and from cold-air work space 506 on its other sides. Alternatively, air may be cooled by coils defining a border of warm-air plenums 504a, 504b and expelled directly into workspace 506, such as at the tops of warm-air plenums 504a, 504b.

Cooling coils 512a, 512b may be located on opposed sides of the plenum approximately flush with the fronts of the racks. (The racks in the same row as the plenum 508, coming in and out of the page in the figure, are not shown.) The coils may have a large surface area and be very thin so as to present a low pressure drop to the system 500. In this way, slower, smaller, and quieter fans may be used to drive air through the system. Protective structures such as louvers or wire mesh may be placed in front of the coils 512a, 512b to prevent them from being damaged.

In operation, fan 510 pushes air down into plenum 508, causing increased pressure in plenum 508 to push air out through cooling coils 512a, 512b. As the air passes through the coils 512a, 512b, its heat is transferred into the water in the coils 512a, 512b, and the air is cooled.

The speed of the fan 510 and/or the flow rate or temperature of cooling water flowing in the cooling coils 512a, 512b may be controlled in response to measured values. For example, the pumps driving the cooling liquid may be variable speed pumps that are controlled to maintain a particular temperature in work space 506. Such control mechanisms may be used to maintain a constant temperature in workspace 506 or plenums 504a, 504b and attic 505.

The workspace 506 air may then be drawn into racks 502a, 502b such as by fans mounted on the many trays that are mounted in racks 502a, 502b. This air may be heated as it passes over the trays and through power supplies running the computers on the trays, and may then enter the warm-air plenums 504a, 504b. Each tray may have its own power supply and fan, with the power supply at the back edge of the tray, and the fan attached to the back of the power supply. All of the fans may be configured or programmed to deliver air at a single common temperature, such as at a set 113° F. (45° C.). The process may then be continuously readjusted as fan 510 captures and circulates the warm air.

Additional items may also be cooled using system 500. For example, room 516 is provided with a self-contained fan-coil unit 514 which contains a fan and a cooling coil. The unit 514 may operate, for example, in response to a thermostat provided in room 516. Room 516 may be, for example, an office or other workspace ancillary to the main portions of the data center 501.

In addition, supplemental cooling may also be provided to room 516 if necessary. For example, a standard roof-top or similar air-conditioning unit (not shown) may be installed to provide particular cooling needs on a spot basis. As one example, system 500 may be designed to deliver 78° F. (25.56° C.) supply air to work space 506, and workers may prefer to have an office in room 516 that is cooler. Thus, a dedicated air-conditioning unit may be provided for the office. This unit may be operated relatively efficiently, however, where its coverage is limited to a relatively small area of a building or a relatively small part of the heat load from a building. Also, cooling units, such as chillers, may provide for supplemental cooling, though their size may be reduced substantially compared to if they were used to provide substantial cooling for the system 500.

Fresh air may be provided to the workspace 506 by various mechanisms. For example, a supplemental air-conditioning unit (not shown), such as a standard roof-top unit may be provided to supply necessary exchanges of outside air. Also, such a unit may serve to dehumidify the workspace 506 for the limited latent loads in the system 500, such as human perspiration. Alternatively, louvers may be provided from the outside environment to the system 500, such as powered louvers to connect to the warm air plenum 504*b*. System 500 may be controlled to draw air through the plenums when environmental (outside) ambient humidity and temperature are sufficiently low to permit cooling with outside air. Such louvers may also be ducted to fan 510, and warm air in plenums 504*a*, 504*b* may simply be exhausted to atmosphere, so that the outside air does not mix with, and get diluted by, the warm air from the computers. Appropriate filtration may also be provided in the system, particularly where outside air is used.

Also, the workspace 506 may include heat loads other than the trays, such as from people in the space and lighting. Where the volume of air passing through the various racks is very high and picks up a very large thermal load from multiple computers, the small additional load from other sources may be negligible, apart from perhaps a small latent heat load caused by workers, which may be removed by a smaller auxiliary air conditioning unit as described above.

Cooling water may be provided from a cooling water circuit powered by pump 524. The cooling water circuit may be formed as a direct-return, or indirect-return, circuit, and may generally be a closed-loop system. Pump 524 may take any appropriate form, such as a standard centrifugal pump. Heat exchanger 522 may remove heat from the cooling water in the circuit. Heat exchanger 522 may take any appropriate form, such as a plate-and-frame heat exchanger or a shell-and-tube heat exchanger.

Heat may be passed from the cooling water circuit to a condenser water circuit that includes heat exchanger 522, pump 520, and cooling tower 518. Pump 520 may also take any appropriate form, such as a centrifugal pump. Cooling tower 518 may be, for example, one or more forced draft towers or induced draft towers. The cooling tower 518 may be considered a free cooling source, because it requires power only for movement of the water in the system and in some implementations the powering of a fan to cause evaporation; it does not require operation of a compressor in a chiller or similar structure.

The cooling tower 518 may take a variety of forms, including as a hybrid cooling tower. Such a tower may combine both the evaporative cooling structures of a cooling tower with a water-to-water heat exchanger. As a result, such a tower may be fit in a smaller face and be operated more modularly than a standard cooling tower with separate heat exchanger. Additional advantage may be that hybrid towers may be run dry, as discussed above. In addition, hybrid towers may also better avoid the creation of water plumes that may be viewed negatively by neighbors of a facility.

As shown, the fluid circuits may create an indirect waterside economizer arrangement. This arrangement may be relatively energy efficient, in that the only energy needed to power it is the energy for operating several pumps and fans. In addition, this system may be relatively inexpensive to implement, because pumps, fans, cooling towers, and heat exchangers are relatively technologically simple structures that are widely available in many forms. In addition, because the structures are relatively simple, repairs and maintenance may be less expensive and easier to complete. Such repairs may be possible without the need for technicians with highly specialized knowledge.

Alternatively, direct free cooling may be employed, such as by eliminating heat exchanger 522, and routing cooling tower water (condenser water) directly to cooling coils 512*a*, 512*b* (not shown). Such an implementation may be more efficient, as it removes one heat exchanging step. However, such an implementation also causes water from the cooling tower 518 to be introduced into what would otherwise be a closed system. As a result, the system in such an implementation may be filled with water that may contain bacteria, algae, and atmospheric contaminants, and may also be filled with other contaminants in the water. A hybrid tower, as discussed above, may provide similar benefits without the same detriments.

Control valve 526 is provided in the condenser water circuit to supply make-up water to the circuit. Make-up water may generally be needed because cooling tower 518 operates by evaporating large amounts of water from the circuit. The control valve 526 may be tied to a water level sensor in cooling tower 518, or to a basin shared by multiple cooling towers. When the water falls below a predetermined level, control valve 526 may be caused to open and supply additional makeup water to the circuit. A back-flow preventer (BFP) may also be provided in the make-up water line to prevent flow of water back from cooling tower 518 to a main water system, which may cause contamination of such a water system.

Optionally, a separate chiller circuit may be provided. Operation of system 500 may switch partially or entirely to this circuit during times of extreme atmospheric ambient, e.g., hot and humid, conditions or times of high heat load in the data center 501. Controlled mixing valves 534 are provided for electronically switching to the chiller circuit, or for blending cooling from the chiller circuit with cooling from the condenser circuit. Pump 528 may supply tower water to chiller 530, and pump 532 may supply chilled water, or cooling water, from chiller 530 to the remainder of system 500. Chiller 530 may take any appropriate form, such as a centrifugal, reciprocating, or screw chiller, or an absorption chiller.

The chiller circuit may be controlled to provide various appropriate temperatures for cooling water. In some implementations, the chilled water may be supplied exclusively to a cooling coil, while in others, the chilled water may be mixed, or blended, with water from heat exchanger 522, with common return water from a cooling coil to both structures. The chilled water may be supplied from chiller 530 at temperatures elevated from typical chilled water temperatures. For example, the chilled water may be supplied at temperatures of 55° F. (13° C.) to 65 to 70° F. (18 to 21° C.) or higher. The water may then be returned at temperatures like those discussed below, such as 59 to 176° F. (15 to 80° C.). In this approach that uses sources in addition to, or as an alternative to, free cooling, increases in the supply temperature of the chilled water can also result in substantial efficiency improvements for the system 500.

Pumps 520, 524, 528, 532, may be provided with variable speed drives. Such drives may be electronically controlled by a central control system 503 to change the amount of water pumped by each pump in response to changing set points or changing conditions in the system 500. For example, pump 524 may be controlled to maintain a particular temperature in workspace 506, such as in response to signals from a thermostat or other sensor in workspace 506.

As illustrated, control system 503 may be communicably coupled (shown through dashed lines that represent wired or wireless communication) to one or more components of the system 500. Although shown as coupled to some, but not all, of the components of system 500 (e.g., valves, pumps, fans, VFDs, motor controllers, and otherwise), the control system 503 is typically communicably coupled to all components that require automated operation. In some aspects, the control system 503 comprises one or more microprocessor-based secondary controllers (e.g., corresponding to and possibly mounted near each component of system 500) as well as, in some aspects, a microprocessor-based main controller that communicates with and controls at least some of the secondary controllers. Each controller may include hardware and software instructions stored in memory and executable by the processor in each controller. In some aspects, the control system 503 may perform one or more processes described herein, such as, for instance, method 200 shown in FIGS. 2A-2B.

In operation, system 500 (and more particularly, control system 503) may respond to signals from various sensors placed in the system 500. The sensors may include, for example, thermostats, humidistats, flowmeters, and other similar sensors. In one implementation, one or more thermostats may be provided in warm air plenums 504a, 504b, and one or more thermostats may be placed in workspace 506. In addition, air pressure sensors may be located in workspace 506, and in warm air plenums 504a, 504b. The thermostats may be used to control the speed of associated pumps, so that if temperature begins to rise, the pumps turn faster to provide additional cooling waters. Thermostats may also be used to control the speed of various items such as fan 510 to maintain a set pressure differential between two spaces, such as attic 505 and workspace 506, and to thereby maintain a particular airflow rate. Where mechanisms for increasing cooling, such as speeding the operation of pumps, are no longer capable of keeping up with increasing loads, a control system may activate chiller 530 and associated pumps 528, 532, and may modulate control valves 534 accordingly to provide additional cooling.

Various values for temperature of the fluids in system 500 may be used in the operation of system 500. In one exemplary implementation, the temperature setpoint in warm air plenums 504a, 504b may be selected to be at or near a maximum exit temperature for trays in racks 502a, 502b. This maximum temperature may be selected, for example, to be a known failure temperature or a maximum specified operating temperature for components in the trays, or may be a specified amount below such a known failure or specified operating temperature. In certain implementations, a temperature of 45° C. may be selected. In other implementations, temperatures of 25° C. to 125° C. may be selected. Higher temperatures may be particularly appropriate where alternative materials are used in the components of the computers in the data center, such as high temperature gate oxides and the like.

In one implementation, supply temperatures for cooling water may be 68° F. (20° C.), while return temperatures may be 104° F. (40° C.). In other implementations, temperatures of 50° F. to 84.20° F. or 104° F. (10° C. to 29° C. or 40° C.) may be selected for supply water, and 59° F. to 176° F. (15° C. to 80° C.) for return water. Chilled water temperatures may be produced at much lower levels according to the specifications for the particular selected chiller. Cooling tower water supply temperatures may be generally slightly above the wet bulb temperature under ambient atmospheric conditions, while cooling tower return water temperatures will depend on the operation of the system 500.

Using these parameters and the parameters discussed above for entering and exiting air, relatively narrow approach temperatures may be achieved with the system 500. The approach temperature, in this example, is the difference in temperature between the air leaving a coil and the water entering a coil. The approach temperature will always be positive because the water entering the coil is the coldest water, and will start warming up as it travels through the coil. As a result, the water may be appreciably warmer by the time it exits the coil, and as a result, air passing through the coil near the water's exit point will be warmer than air passing through the coil at the water's entrance point. Because even the most-cooled exiting air, at the cooling water's entrance point, will be warmer than the entering water, the overall exiting air temperature will need to be at least somewhat warmer than the entering cooling water temperature.

Keeping the approach temperature small permits a system to be run on free, or evaporative, cooling for a larger portion of the year and reduces the size of a needed chiller, if any is needed at all. To lower the approach temperature, the cooling coils may be designed for counterflow rather than for self-draining. In counter-flow, the warmest air flows near the warmest water and the coolest air exits near where the coolest water enters.

In certain implementations, the entering water temperature may be 64° F. (18° C.) and the exiting air temperature 64.4° F. (25° C.), as noted above, for an approach temperature of 12.6° F. (7° C.). In other implementations, wider or narrower approach temperature may be selected based on economic considerations for an overall facility.

With a close approach temperature, the temperature of the cooled air exiting the coil will closely track the temperature of the cooling water entering the coil. As a result, the air temperature can be maintained, generally regardless of load, by maintaining a constant water temperature. In an evaporative cooling mode, a constant water temperature may be maintained as the wet bulb temperature stays constant (or changes very slowly), and by blending warmer return water with supply water as the wet bulb temperature falls. As such, active control of the cooling air temperature can be avoided in certain situations, and control may occur simply on the cooling water return and supply temperatures. The air temperature may also be used as a check on the water temperature, where the water temperature is the relevant control parameter.

These general and specific aspects described above may be implemented using a device, system or method, or any combinations of devices, systems, or methods. For example, a system of one or more computers can be configured to perform particular actions by virtue of having software, firmware, hardware, or a combination of them installed on the system that in operation causes or cause the system to perform the actions. One or more computer programs can be configured to perform particular actions by virtue of including instructions that, when executed by data processing apparatus, cause the apparatus to perform the actions. The details of one or more implementations are set forth in the accompanying drawings and the description below. Other features, objects, and advantages will be apparent from the description and drawings, and from the claims.

A number of implementations have been described. Nevertheless, it will be understood that various modifications may be made. For example, other methods described herein besides those, or in addition to those, illustrated in FIGS. 2A-2B can be performed. Further, the illustrated steps of method 200 can be performed in different orders, either concurrently or serially. Further, steps can be performed in addition to those illustrated in method 200, and some steps illustrated in method 200 can be omitted without deviating from the present disclosure. Further, various combinations of the components described herein may be provided for implementations of similar apparatuses. Accordingly, other implementations are within the scope of the present disclosure.

What is claimed is:

1. A method for cooling a data center, the method comprising:
   circulating a cooling airflow to cool a plurality of computing devices supported in racks in a data center;
   monitoring power usage of the plurality of computing devices;
   determining that a first portion of the plurality of computing devices are operating at a power usage above a threshold power usage; and
   based on the determination:
   decreasing a flow rate of a portion of a cooling liquid in the data center that is circulated to cool a second portion of the plurality of computing devices that are operating at a power usage below the threshold power usage;
   based on decreasing the flow rate of the portion of the cooling liquid in the data center that is circulated to cool the second portion of the plurality of computing devices, increasing a portion of the cooling airflow circulated to cool the second portion of the plurality of computing devices such that a rate of heat removal from the second portion of the plurality of computing devices remains substantially constant; and
   rerouting at least some of the portion of the cooling liquid in the data center that is circulated to cool the second portion of the plurality of computing devices to increase a flow rate of a portion of the cooling liquid in the data center that is circulated to cool the first portion of the plurality of computing devices such that a rate of heat removal from the first portion of the plurality of computing devices increases.

2. The method of claim 1, wherein monitoring power usage of the plurality of computing devices comprises monitoring a utilization of each of the plurality of computing devices.

3. The method of claim 2, wherein the threshold power usage corresponds to an adjustable threshold utilization that is a particular percentage of a maximum utilization.

4. The method of claim 3, wherein the adjustable threshold utilization is about 70% of maximum utilization.

5. The method of claim 3, wherein utilization comprises CPU utilization of the plurality of computing devices.

6. The method of claim 1, further comprising:
   monitoring a temperature at or near the first portion of the plurality of computing devices; and
   subsequent to increasing flow rate of a portion of the cooling liquid in the data center that is circulated to cool the first portion of the plurality of computing devices, determining that the temperature remains substantially constant or that the temperature rises at or near the first portion of the plurality of computing devices.

7. The method of claim 6, further comprising:
   based on the determination that the temperature remains substantially constant or that the temperature rises at or near the first portion of the plurality of computing devices, increasing a portion of the cooling airflow circulated to cool the first portion of the plurality of computing devices such that the rate of heat removal from the first portion of the plurality of computing devices further increases.

8. The method of claim 1, further comprising:
   determining that the first portion of the plurality of computing devices are operating at a power usage at or below the threshold power usage for a predetermined time duration, or that the first portion of the plurality of computing devices are operating at a power usage at a particular setpoint below the threshold power usage.

9. The method of claim 8, further comprising:
   based on the determination, decreasing the flow rate of the portion of the cooling liquid in the data center that is circulated to cool the first portion of the plurality of computing devices; and
   modulating an airflow circulated to cool the first portion of the plurality of computing devices to maintain the rate of heat removal from the first portion of the plurality of computing devices.

10. The method of claim 1, wherein the data center comprises a cooling capacity that is less than a cooling load required to cool all of the plurality of computing devices operating at a maximum power draw.

11. The method of claim 10, further comprising:
    deploying an additional plurality of computing devices supported in racks in the data center.

12. The method of claim 1, wherein the first portion of the plurality of computing devices and the second portion of the plurality of computing devices are located in different racks positioned in the data center.

13. The method of claim 12, wherein the different racks are located in different rows of racks positioned in the data center.

14. The method of claim 1, wherein a cooling power capacity of the data center cooling liquid supply volume is less than a heat output from the plurality of computing devices supported in racks in the data center operating at 100% utilization.

15. The method of claim 14, wherein a sum of the cooling power capacity of the data center cooling liquid supply volume and a cooling power capacity of a total cooling airflow volumetric flow rate exceeds the heat output from the plurality of computing devices supported in racks in the data center operating at 100% utilization.

16. A computer storage medium encoded with a computer program, the program comprising instructions that when executed by one or more computers cause the one or more computers to perform operations comprising:
controlling a circulation of a cooling airflow to cool a plurality of computing devices supported in racks in a data center;
monitoring power usage of the plurality of computing devices;
determining that a first portion of the plurality of computing devices are operating at a power usage above a threshold power usage; and
based on the determination:
controlling one or more flow control devices to decrease a flow rate of a portion of a cooling liquid in the data center that is circulated to cool a second portion of the plurality of computing devices that are operating at a power usage below the threshold power usage;
based on controlling the one or more flow control devices to decrease the flow rate of the portion of the cooling liquid in the data center that is circulated to cool the second portion of the plurality of computing devices, controlling one or more fans to increase a portion of the cooling airflow circulated to cool the second portion of the plurality of computing devices such that a rate of heat removal from the second portion of the plurality of computing devices remains substantially constant; and
controlling one or more flow control devices to reroute at least some of the portion of the cooling liquid in the data center that is circulated to cool the second portion of the plurality of computing devices to increase a flow rate of a portion of the cooling liquid in the data center that is circulated to cool the first portion of the plurality of computing devices such that a rate of heat removal from the first portion of the plurality of computing devices increases.

17. The computer storage medium of claim 16, wherein monitoring power usage of the plurality of computing devices comprises monitoring a utilization of each of the plurality of computing devices.

18. The computer storage medium of claim 17, wherein the threshold power usage corresponds to an adjustable threshold utilization that is a particular percentage of a maximum utilization.

19. A data center cooling management system, comprising:
a plurality of rack-mounted computers;
one or more cooling modules positioned near the plurality of rack-mounted computers; and
a control system comprising one or more sensors and one or more flow control devices, the control system operable to perform operations comprising:
controlling one or more cooling modules to circulate a cooling airflow to cool the plurality of rack-mounted computers;
monitoring, with the one or more sensors, power usage of the plurality of rack-mounted computers;
determining, with the one or more sensors, that a first portion of the plurality of rack-mounted computers are operating at a power usage above a threshold power usage; and
based on the determination:
controlling the one or more flow control devices to decrease a flow rate of a portion of a cooling liquid in the data center that is circulated to cool a second portion of the plurality of rack-mounted computers that are operating at a power usage below the threshold power usage;
based on controlling the one or more flow control devices to decrease the flow rate of the portion of the cooling liquid in the data center that is circulated to cool the second portion of the plurality of computing devices, controlling the one or more cooling modules to increase a portion of the cooling airflow circulated to cool the second portion of the plurality of rack-mounted computers such that a rate of heat removal from the second portion of the plurality of rack-mounted computers remains substantially constant; and
controlling the one or more flow control devices to circulate at least some of the portion of the cooling liquid in the data center that is circulated to cool the second portion of the plurality of rack-mounted computers to increase a flow rate of a portion of the cooling liquid in the data center that is circulated to cool the first portion of the plurality of rack-mounted computers such that a rate of heat removal from the first portion of the plurality of rack-mounted computers increases.

20. The system of claim 19, wherein monitoring power usage of the plurality of rack-mounted computers comprises monitoring a utilization of each of the plurality of rack-mounted computers.

21. The system of claim 19, wherein the operations further comprise:
monitoring, with the one or more sensors, a temperature at or near the first portion of the plurality of rack-mounted computers; and
subsequent to increasing flow rate of a portion of the cooling liquid in the data center that is circulated to cool the first portion of the plurality of rack-mounted computers, determining that the temperature remains substantially constant or that the temperature rises at or near the first portion of the plurality of rack-mounted computers.

22. A method for cooling a data center, the method comprising:
circulating a first cooling medium to cool a plurality of rack-mounted computers;
circulating a second cooling medium to cool the plurality of rack-mounted computers;
determining that a first portion of the plurality of rack-mounted computers is operating at a power usage above a threshold power usage;
based on the determination that the first portion of the plurality of rack-mounted computers is operating at the power usage above the threshold power usage, adjusting a flow rate of at least one of the first or second cooling mediums to cool a second portion of the plurality of rack-mounted computers that is operating at a power usage at or below the threshold power usage;
rerouting a portion of the at least one of the first or second cooling mediums from being circulated to the second portion of the plurality of rack-mounted computers to cool the first portion of the plurality of rack-mounted computers; and
augmenting another portion of the at least one of the first or second cooling mediums used to cool the first portion of the plurality of rack-mounted computers with the rerouted portion of the at least one of the first or second cooling mediums.

23. The method of claim 22, further comprising:
determining that the second portion of the plurality of rack-mounted computers is operating at a power usage below a threshold power usage.

24. The method of claim 22, wherein the first cooling medium is a cooling airflow and the second cooling medium is a cooling liquid.

25. The method of claim 24, wherein adjusting at least one of a flow rate of the first or second cooling mediums to cool a second portion of the plurality of rack-mounted computers comprises:
increasing a flow rate of the cooling airflow to cool the second portion of the plurality of rack-mounted computers; and
decreasing a flow rate of the cooling liquid to cool the second portion of the plurality of rack-mounted computers.

26. The method of claim 22, wherein circulating a second cooling medium to cool the plurality of rack-mounted computers comprises:
circulating, to the data center, a cooling liquid flow from one or more central plants that comprise a cooling capacity less than a maximum cooling capacity required to cool the plurality of rack-mounted computers operating at a maximum power load.

* * * * *